US012791921B2

(12) United States Patent
Platner et al.

(10) Patent No.: US 12,791,921 B2
(45) Date of Patent: Nov. 10, 2026

(54) HEAT CONDUCTOR ASSEMBLY

(71) Applicant: GoPro, Inc., San Mateo, CA (US)

(72) Inventors: David Thomas Platner, San Francisco, CA (US); Raul Vargas Gonzalez, Redwood City, CA (US); Adrian Santos, Lake Forest, CA (US); Jonathan Stern, San Mateo, CA (US); Nicholas Vitale, Foster City, CA (US)

(73) Assignee: GoPro, Inc., San Mateo, CA (US)

( * ) Notice: Subject to any disclaimer, the term of this patent is extended or adjusted under 35 U.S.C. 154(b) by 177 days.

(21) Appl. No.: 18/649,487

(22) Filed: Apr. 29, 2024

(65) Prior Publication Data

US 2024/0393665 A1 Nov. 28, 2024

Related U.S. Application Data

(60) Provisional application No. 63/468,084, filed on May 22, 2023.

(51) Int. Cl.
*G03B 17/55* (2021.01)
*H05K 7/20* (2006.01)

(52) U.S. Cl.
CPC ......... *G03B 17/55* (2013.01); *H05K 7/20409* (2013.01)

(58) Field of Classification Search
CPC ........ H04N 23/55; H04N 23/51; H04N 23/52; H04N 23/54; H04N 23/45; H04N 23/57; H04N 23/50; H04N 17/002; G03B 17/12; G03B 17/55; G03B 2217/002; G03B 19/22; G03B 5/00; G02B 7/021; G02B 7/02; H05K 2201/10121; H05K 2201/10151; H05K 1/0203; H05K 1/0212; H05K 1/141; H05K 1/142; H05K 1/147; H05K 2201/066; H05K 7/20409; H04M 1/0264; H10F 39/80; H10F 39/804; H10F 39/806; H10F 77/60
See application file for complete search history.

(56) References Cited

U.S. PATENT DOCUMENTS 751,347 A 2/1904 Scheimpflug
3,760,704 A 9/1973 Baker
(Continued)

OTHER PUBLICATIONS

Pan, Peng-Cheng, A Handheld Panoramic Camera, Aug. 11, 2017, PE2E Search Translation (Year: 2017).*
(Continued)

*Primary Examiner* — Michael A Matey
(74) *Attorney, Agent, or Firm* — Young Basile Hanlon & MacFarlane, P.C.

(57) ABSTRACT

An image capture apparatus includes first and second image sensors that generates heat and are opposed a space from each other and a housing assembly that encloses the first and second image sensors. The image capture apparatus includes first and second circuit boards that are connected respectively and separately with the first and second image sensors, and the first and second circuit boards include a peripheral edge that extends from the first and second image sensors to an outside of the housing assembly. The image capture apparatus includes a heatsink assembly positioned on the outside of the housing assembly and a heat conductor assembly that is extended between the heatsink assembly and the first and second circuit boards.

19 Claims, 10 Drawing Sheets

(56) References Cited

U.S. PATENT DOCUMENTS

| | | | | |
|---|---|---|---|---|
| 3,818,498 | A | 6/1974 | Zehnpfennig | |
| 4,109,263 | A | 8/1978 | Johnson | |
| 4,119,980 | A | 10/1978 | Baker | |
| 5,332,031 | A | 7/1994 | Kiga | |
| 5,721,585 | A | 2/1998 | Keast | |
| D467,259 | S | 12/2002 | Hung | |
| 6,726,331 | B2 | 4/2004 | Miyata | |
| 7,422,382 | B2 * | 9/2008 | Seo | H04N 23/54 348/E5.025 |
| 7,539,412 | B2 * | 5/2009 | Lee | G03B 17/02 396/529 |
| 7,619,683 | B2 * | 11/2009 | Davis | H04N 23/57 348/222.1 |
| 7,965,336 | B2 | 6/2011 | Bingle | |
| 8,149,327 | B2 | 4/2012 | Lin | |
| 9,185,279 | B2 * | 11/2015 | Masuda | H04N 23/65 |
| 9,307,672 | B2 | 4/2016 | Chilek | |
| 9,456,113 | B2 | 9/2016 | Masuda | |
| 9,509,890 | B2 | 11/2016 | Nakayama | |
| 9,554,041 | B1 * | 1/2017 | Shin | H04N 23/90 |
| 9,591,215 | B1 | 3/2017 | Miller | |
| 9,607,358 | B2 | 3/2017 | Takenaka | |
| 9,736,372 | B2 | 8/2017 | Masuda | |
| 9,742,996 | B1 | 8/2017 | Martin | |
| 9,838,599 | B1 | 12/2017 | Tam | |
| 9,992,414 | B2 | 6/2018 | Masuda | |
| 10,054,845 | B1 * | 8/2018 | Garcia | G03B 37/04 |
| 10,108,073 | B2 | 10/2018 | Chiu | |
| 10,291,828 | B1 | 5/2019 | Hsu | |
| 10,382,681 | B2 | 8/2019 | Masuda | |
| 10,397,453 | B2 | 8/2019 | Choi | |
| 10,404,912 | B2 * | 9/2019 | Ogawa | G06T 3/4038 |
| 10,652,458 | B2 * | 5/2020 | Kang | H04N 23/698 |
| 10,666,360 | B2 | 5/2020 | Saathoff | |
| 10,666,860 | B2 | 5/2020 | Takenaka | |
| 10,742,879 | B2 * | 8/2020 | Wang | H04N 23/45 |
| 10,855,919 | B2 | 12/2020 | Masuda | |
| 10,855,979 | B2 | 12/2020 | Pace | |
| 10,917,544 | B2 | 2/2021 | Sharma | |
| 2002/0057337 | A1 | 5/2002 | Kumler | |
| 2003/0066672 | A1 | 4/2003 | Watchko | |
| 2006/0049350 | A1 | 3/2006 | Teich | |
| 2007/0002131 | A1 | 1/2007 | Ritchey | |
| 2007/0013779 | A1 | 1/2007 | Gin | |
| 2007/0062905 | A1 | 3/2007 | Hung | |
| 2008/0187303 | A1 | 8/2008 | Ito | |
| 2008/0191124 | A1 | 8/2008 | Irikiin | |
| 2008/0198556 | A1 | 8/2008 | Iwata | |
| 2008/0259201 | A1 * | 10/2008 | Iijima | H04N 23/15 348/335 |
| 2009/0040291 | A1 * | 2/2009 | McCall | H04N 23/698 348/E7.001 |
| 2009/0210190 | A1 | 8/2009 | Carlson | |
| 2009/0303360 | A1 | 12/2009 | Huang | |
| 2009/0315133 | A1 | 12/2009 | Chang | |
| 2010/0045773 | A1 | 2/2010 | Ritchey | |
| 2010/0061716 | A1 | 3/2010 | Iyoda | |
| 2011/0051374 | A1 | 3/2011 | Chen | |
| 2012/0023177 | A1 | 1/2012 | Linden | |
| 2014/0009607 | A1 | 1/2014 | Chen | |
| 2014/0184835 | A1 | 7/2014 | Nozawa | |
| 2014/0192144 | A1 | 7/2014 | St. Clair | |
| 2014/0218587 | A1 * | 8/2014 | Shah | H04N 23/55 348/340 |
| 2014/0240454 | A1 | 8/2014 | Hirata | |
| 2014/0316198 | A1 | 10/2014 | Krivopisk | |
| 2015/0022718 | A1 | 1/2015 | Kano | |
| 2015/0326057 | A1 | 11/2015 | Koyanagi | |
| 2015/0348580 | A1 | 12/2015 | Van Hoff | |
| 2016/0178410 | A1 | 6/2016 | Bishop | |
| 2016/0227079 | A1 | 8/2016 | Oh | |
| 2016/0301819 | A1 | 10/2016 | Petty | |
| 2016/0349600 | A1 | 12/2016 | Macmillan | |
| 2017/0054907 | A1 | 2/2017 | Nishihara | |
| 2017/0104951 | A1 | 4/2017 | Wada | |
| 2017/0195533 | A1 | 7/2017 | Seo | |
| 2017/0299949 | A1 | 10/2017 | Donaldson | |
| 2018/0039162 | A1 | 2/2018 | Ali | |
| 2018/0113256 | A1 | 4/2018 | Shaw | |
| 2018/0139867 | A1 * | 5/2018 | Muramatsu | G03B 17/02 |
| 2018/0220548 | A1 | 8/2018 | Onuchin | |
| 2018/0317339 | A1 * | 11/2018 | Evans, V | H04M 1/0202 |
| 2019/0029102 | A1 | 1/2019 | Chen | |
| 2019/0052785 | A1 * | 2/2019 | Ai | H04N 23/58 |
| 2019/0137724 | A1 | 5/2019 | Kim | |
| 2019/0146313 | A1 | 5/2019 | De La Cruz | |
| 2019/0243217 | A1 | 8/2019 | Park | |
| 2019/0267416 | A1 | 8/2019 | Kohama | |
| 2020/0037471 | A1 * | 1/2020 | Kaga | H04N 23/52 |
| 2020/0089084 | A1 | 3/2020 | Chen | |
| 2020/0120250 | A1 | 4/2020 | Colin | |
| 2020/0296268 | A1 | 9/2020 | Cutler | |
| 2020/0351419 | A1 * | 11/2020 | Sharma | H04N 23/55 |
| 2021/0111210 | A1 * | 4/2021 | Vitale | H10F 39/8063 |
| 2021/0218872 | A1 * | 7/2021 | Cotoros | H04N 23/617 |
| 2021/0234995 | A1 | 7/2021 | Sharma | |
| 2022/0124234 | A1 | 4/2022 | Kawai | |
| 2022/0400192 | A1 * | 12/2022 | Vitale | G02B 7/021 |
| 2023/0005976 | A1 * | 1/2023 | Takeuchi | H10F 39/804 |
| 2023/0122268 | A1 | 4/2023 | Hsu | |

OTHER PUBLICATIONS

Randall Hand, "Immersive Media's Dodeca 2360 Spherical Video Camera", VizWorld, Nov. 12, 2025, 4 pages.

The Magazine of Panoramic Imaging, Jun.-Jul. 1996, vol. 13, No. 3, 20 pages.

The Magazine of Panoramic Imaging, Mar.-Apr. 1996, vol. 13, No. 2, 20 pages.

Wikipedia—Heat Sink,https://en.wikipedia.org/w/index.php?title=Heat_sink&oldid=881792434 revised Feb. 4, 2019, retrieved Feb. 2, 2023 (Year: 2019).

* cited by examiner

HEAT CONDUCTOR ASSEMBLY

CROSS-REFERENCE TO RELATED APPLICATIONS

This application claims benefit and priority to U.S. Application No. 63/468,084, filed on May 22, 2023, which is incorporated herein by reference in its entirety.

TECHNICAL FIELD

The present disclosure relates to a heat conductor assembly that is configured to move heat from two heat generating components.

BACKGROUND

Image capture devices have many features to provide a variety of techniques to capture images. One feature that can be included is a dual lens system so that the image capture device can observe a 360-degree view. While using a dual lens system provides for increased image capture abilities, this feature often utilizes the implementation of two distinct image sensors. The image sensors generate considerable heat within the image capture device, which can reduce operation time of the image capture device. To mitigate this issue, what is needed is a heat conductor assembly that can improve heat management of an image capture device with two image sensors.

SUMMARY

Disclosed herein are implementations of an image capture apparatus that includes first and second image sensors that generates heat and are opposed a space from each other and a housing assembly that encloses the first and second image sensors. The image capture apparatus includes first and second circuit boards that are connected respectively and separately with the first and second image sensors, and the first and second circuit boards include a peripheral edge that extends from the first and second image sensors to an outside of the housing assembly. The image capture apparatus includes a heatsink assembly positioned on the outside of the housing assembly and a heat conductor assembly that is extended between the heatsink assembly and the first and second circuit boards.

In some implementations, the housing assembly may include channel having two separate openings that extend from the space to the outside of the housing assembly, and the heat conductor assembly may contact the first and second circuit boards within the space and extends to the heatsink assembly through the channel. The housing assembly may include an opening to the outside of the housing assembly, and the heat conductor assembly may contact the first and second circuit boards within the space and extends to the heatsink assembly through the opening. The heatsink assembly may include a first heatsink connected to the first circuit board through the heat conductor assembly and a second heatsink connected to the second circuit board through the heat conductor assembly. The first and second heatsinks may be separated from each other. The heat conductor assembly may include a first heat conductor that connects the first heatsink and the first circuit board and a second heat conductor that connects the second heatsink and the second circuit board. The first and second heat conductors may be separated from each other. The heat conductor assembly may include a first heat conductor that extends between the heatsink assembly and the peripheral edge of the first circuit board and a second heat conductor that extends between the heatsink assembly and the peripheral edge of the first circuit board. The first and second heat conductors may extend to different heatsinks of the heatsink assembly. The first and second heat conductors may extend from a single heatsink of the heatsink assembly. The heat conductor assembly may only contact the peripheral edges of the first and second circuit boards. The heat conductor assembly may be positioned within the space and contact only the first and second circuit boards at the space between the first and second circuit boards.

In another implementation, an image capture apparatus includes a pair of opposing image sensor assemblies that generate heat, are separated by a space, and are aligned along an optical axis. The image capture apparatus includes first and second walls that bridge between the pair of opposing image sensor assemblies and a heatsink that is separated from the pair of opposing image sensor assemblies and the first and second walls. The image capture apparatus includes a heat conductor assembly that is connected to the pair of opposing image sensor assemblies, extends through a channel positioned between the first and second walls, and is connected to the heatsink.

In some implementations, the image capture apparatus may further include a third wall that bridges between the pair of opposing image sensor assemblies and the first and second walls. The heat conductor assembly may include a first flexible heat conductor connected with one of the pair of opposing image sensor assemblies and the heatsink through the channel; and a second flexible heat conductor connected with another of the pair of opposing image sensor assemblies and the heatsink or a different heatsink through the channel. The first and second flexible heat conductors may be separated from each other within the channel. The heat conductor assembly may include a rigid heat conductor that extends between the heatsink and the pair of opposing image sensor assemblies, and the rigid heat conductor is connected to each of the pair of opposing image sensor assemblies by a separate thermal pad or a separate thermal paste. The rigid heat conductor may be connected with the heatsink and a different heatsink that are separate.

In another implementation, an image capture apparatus includes an image sensor assembly that includes a housing that includes one or more openings and first and second image sensors that are optically aligned and fully enclosed within the housing. The housing includes a first circuit board partially enclosed in the housing and thermally connected with the first image sensor and a second circuit board partially enclosed in the housing, opposed a space from the first circuit board and thermally connected with the second image sensor. The image capture apparatus may include a heatsink external of the housing and configured to dissipate heat and a heat conductor assembly positioned between the first and second circuit boards, the heat conductor assembly configured to thermally couple the heatsink with a portion of the first and second circuit boards that are each independently positioned within or external of the housing.

In some implementations, the image capture apparatus may include a body that encloses the image sensor assembly, the heatsink, and the heat conductor assembly. The heat conductor assembly may include the first and second circuit boards are connected by a thermal paste or a thermal pad. The heat conductor assembly may include a rigid heat conductor positioned between the first and second circuit board. The heat conductor assembly may include a first heat conductor that connects the heatsink and the first circuit board and a second heat conductor that connects the heatsink and the second circuit board.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The present disclosure provides for a heat conductor assembly that can dissipate heat from within or outside of an image sensor housing to a separate heatsink so that the operation time of image capture apparatus is increased. In some examples, the heat conductor assembly includes flexible or rigid heat conductors to move heat from inside of an image sensor housing so that the heat is removed directly from the source. In other examples, the circuit boards of the image sensors extend from the image sensor housing and the heat conductors connect circuit boards with the heatsink(s) outside of the image sensor housing. The circuit board may additionally have a trenched or vias configuration to more precisely direct heat either laterally (i.e., in the trenched configuration) towards an outside of the image sensor housing or vertically towards a bottom surface of the circuit board (i.e., in the vias configuration) to more efficiently direct heat to the heat conductors that are either positioned within or outside of the image sensor housing.

Figure 1A:
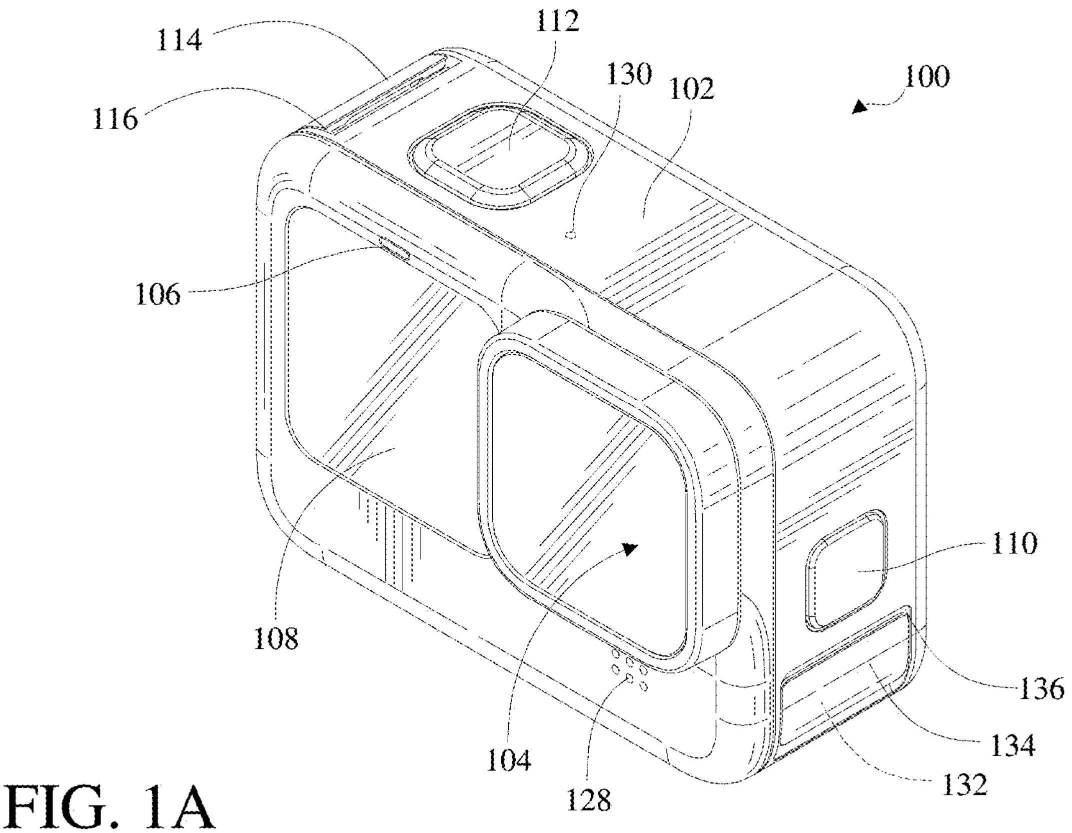
FIGS. 1A-1B are isometric views of an example of an image capture apparatus.
Figure 1B:
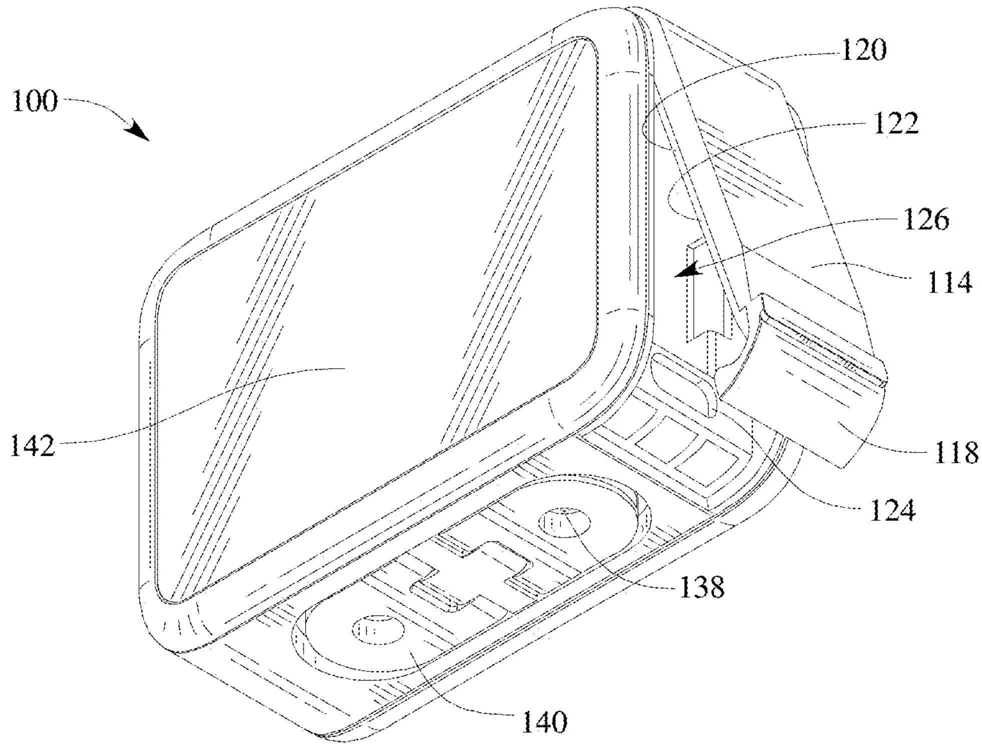
Figure 5:
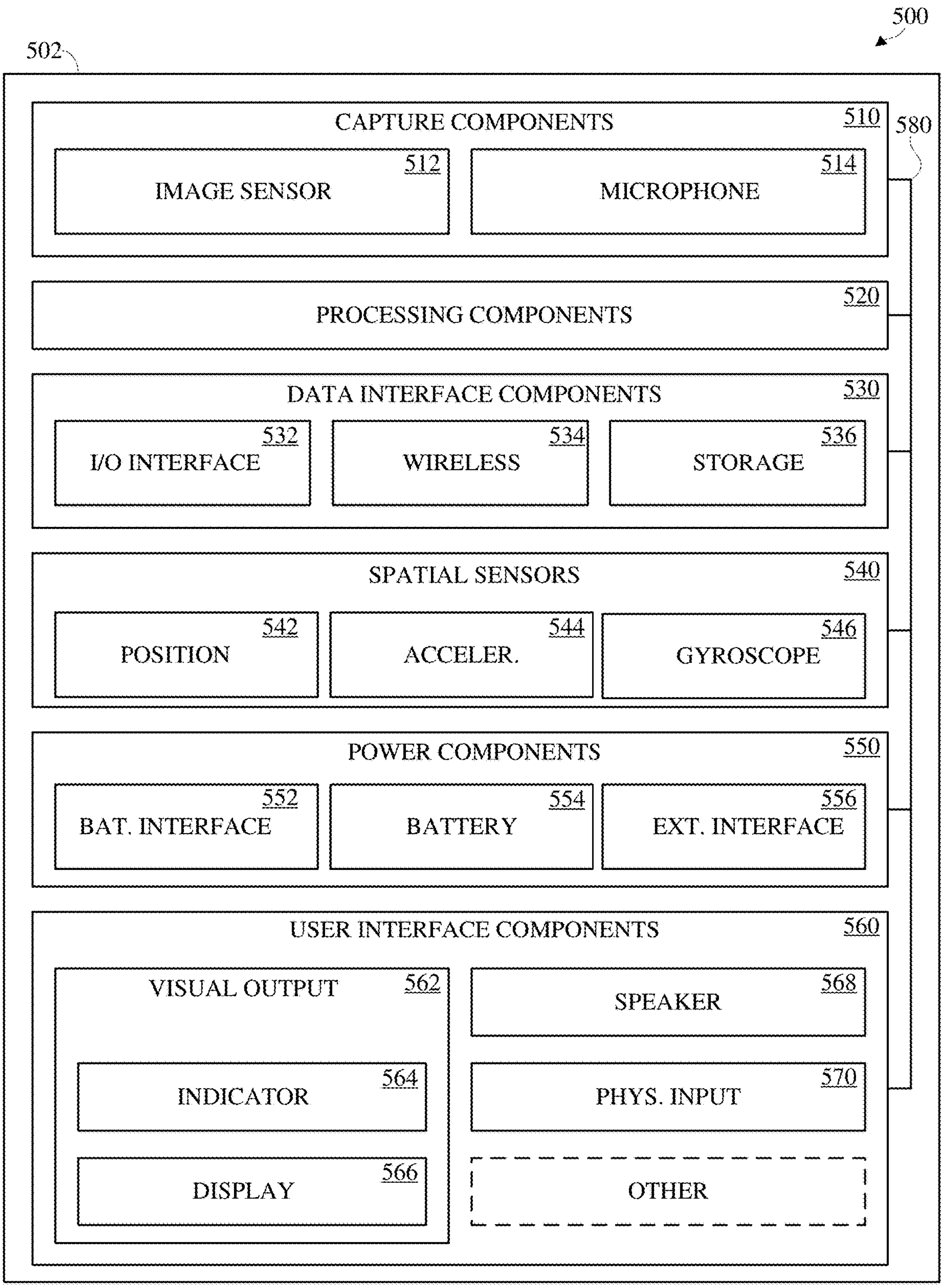
FIG. 5 is a block diagram of electronic components of an image capture apparatus.

FIGS. 1A-1B are isometric views of an example of an image capture apparatus 100. The image capture apparatus 100 includes a body 102, an image capture device 104, an indicator 106, a display 108, a mode button 110, a shutter button 112, a door 114, a hinge mechanism 116, a latch mechanism 118, a seal 120, a battery interface 122, a data interface 124, a battery receptacle 126, microphones 128, 130, 132, a speaker 138, an interconnect mechanism 140, and a display 142. Although not expressly shown in FIGS. 1A-1B, the image capture apparatus 100 includes internal electronics, such as imaging electronics, power electronics, and the like, internal to the body 102 for capturing images and performing other functions of the image capture apparatus 100. An example showing internal electronics is shown in FIG. 5. The arrangement of the components of the image capture apparatus 100 shown in FIGS. 1A-1B is an example, other arrangements of elements may be used, except as is described herein or as is otherwise clear from context.

The body 102 of the image capture apparatus 100 may be made of a rigid material such as plastic, aluminum, steel, or fiberglass. Other materials may be used. The image capture device 104 is structured on a front surface of, and within, the body 102. The image capture device 104 includes a lens. The lens of the image capture device 104 receives light incident upon the lens of the image capture device 104 and directs the received light onto an image sensor of the image capture device 104 internal to the body 102. The image capture apparatus 100 may capture one or more images, such as a sequence of images, such as video. The image capture apparatus 100 may store the captured images and video for subsequent display, playback, or transfer to an external device. Although one image capture device 104 is shown in FIG. 1A, the image capture apparatus 100 may include multiple image capture devices, which may be structured on respective surfaces of the body 102.

As shown in FIG. 1A, the image capture apparatus 100 includes the indicator 106 structured on the front surface of the body 102. The indicator 106 may output, or emit, visible light, such as to indicate a status of the image capture apparatus 100. For example, the indicator 106 may be a light-emitting diode (LED). Although one indicator 106 is shown in FIG. 1A, the image capture apparatus 100 may include multiple indictors structured on respective surfaces of the body 102.

As shown in FIG. 1A, the image capture apparatus 100 includes the display 108 structured on the front surface of the body 102. The display 108 outputs, such as presents or displays, such as by emitting visible light, information, such as to show image information such as image previews, live video capture, or status information such as battery life, camera mode, elapsed time, and the like. In some implementations, the display 108 may be an interactive display, which may receive, detect, or capture input, such as user input representing user interaction with the image capture apparatus 100. In some implementations, the display 108 may be omitted or combined with another component of the image capture apparatus 100.

As shown in FIG. 1A, the image capture apparatus 100 includes the mode button 110 structured on a side surface of the body 102. Although described as a button, the mode button 110 may be another type of input device, such as a switch, a toggle, a slider, or a dial. Although one mode button 110 is shown in FIG. 1A, the image capture apparatus 100 may include multiple mode, or configuration, buttons structured on respective surfaces of the body 102. In some implementations, the mode button 110 may be omitted or combined with another component of the image capture apparatus 100. For example, the display 108 may be an interactive, such as touchscreen, display, and the mode button 110 may be physically omitted and functionally combined with the display 108.

As shown in FIG. 1A, the image capture apparatus 100 includes the shutter button 112 structured on a top surface of the body 102. The shutter button 112 may be another type of input device, such as a switch, a toggle, a slider, or a dial. The image capture apparatus 100 may include multiple shutter buttons structured on respective surfaces of the body 102. In some implementations, the shutter button 112 may be omitted or combined with another component of the image capture apparatus 100.

The mode button 110, the shutter button 112, or both, obtain input data, such as user input data in accordance with user interaction with the image capture apparatus 100. For example, the mode button 110, the shutter button 112, or both, may be used to turn the image capture apparatus 100 on and off, scroll through modes and settings, and select modes and change settings.

As shown in FIG. 1B, the image capture apparatus 100 includes the door 114 coupled to the body 102, such as using the hinge mechanism 116 (FIG. 1A). The door 114 may be secured to the body 102 using the latch mechanism 118 that releasably engages the body 102 at a position generally opposite the hinge mechanism 116. The door 114 includes the seal 120 and the battery interface 122. Although one door 114 is shown in FIG. 1A, the image capture apparatus 100 may include multiple doors respectively forming respective surfaces of the body 102, or portions thereof. The door 114 may be removable from the body 102 by releasing the latch mechanism 118 from the body 102 and decoupling the hinge mechanism 116 from the body 102.

In FIG. 1B, the door 114 is shown in a partially open position such that the data interface 124 is accessible for communicating with external devices and the battery receptacle 126 is accessible for placement or replacement of a battery. In FIG. 1A, the door 114 is shown in a closed position. In implementations in which the door 114 is in the closed position, the seal 120 engages a flange (not shown) to provide an environmental seal and the battery interface 122 engages the battery (not shown) to secure the battery in the battery receptacle 126.

As shown in FIG. 1B, the image capture apparatus 100 includes the battery receptacle 126 structured to form a portion of an interior surface of the body 102. The battery receptacle 126 includes operative connections for power transfer between the battery and the image capture apparatus 100. In some implementations, the battery receptacle 126 may be omitted. The image capture apparatus 100 may include multiple battery receptacles.

As shown in FIG. 1A, the image capture apparatus 100 includes a first microphone 128 structured on a front surface of the body 102, a second microphone 130 structured on a top surface of the body 102, and a third microphone 132 structured on a side surface of the body 102. The third microphone 132, which may be referred to as a drain microphone and is indicated as hidden in dotted line, is located behind a drain cover 134, surrounded by a drain channel 136, and can drain liquid from audio components of the image capture apparatus 100. The image capture apparatus 100 may include other microphones on other surfaces of the body 102. The microphones 128, 130, 132 receive and record audio, such as in conjunction with capturing video or separate from capturing video. In some implementations, one or more of the microphones 128, 130, 132 may be omitted or combined with other components of the image capture apparatus 100.

As shown in FIG. 1B, the image capture apparatus 100 includes the speaker 138 structured on a bottom surface of the body 102. The speaker 138 outputs or presents audio, such as by playing back recorded audio or emitting sounds associated with notifications. The image capture apparatus 100 may include multiple speakers structured on respective surfaces of the body 102.

As shown in FIG. 1B, the image capture apparatus 100 includes the interconnect mechanism 140 structured on a bottom surface of the body 102. The interconnect mechanism 140 removably connects the image capture apparatus 100 to an external structure, such as a handle grip, another mount, or a securing device. The interconnect mechanism 140 includes folding protrusions configured to move between a nested or collapsed position as shown in FIG. 1B and an extended or open position. The folding protrusions of the interconnect mechanism 140 in the extended or open position may be coupled to reciprocal protrusions of other devices such as handle grips, mounts, clips, or like devices. The image capture apparatus 100 may include multiple interconnect mechanisms structured on, or forming a portion of, respective surfaces of the body 102. In some implementations, the interconnect mechanism 140 may be omitted.

As shown in FIG. 1B, the image capture apparatus 100 includes the display 142 structured on, and forming a portion of, a rear surface of the body 102. The display 142 outputs, such as presents or displays, such as by emitting visible light, data, such as to show image information such as image previews, live video capture, or status information such as battery life, camera mode, elapsed time, and the like. In some implementations, the display 142 may be an interactive display, which may receive, detect, or capture input, such as user input representing user interaction with the image capture apparatus 100. The image capture apparatus 100 may include multiple displays structured on respective surfaces of the body 102, such as the displays 108, 142 shown in FIGS. 1A-1B. In some implementations, the display 142 may be omitted or combined with another component of the image capture apparatus 100.

The image capture apparatus 100 may include features or components other than those described herein, such as other buttons or interface features. In some implementations, interchangeable lenses, cold shoes, and hot shoes, or a combination thereof, may be coupled to or combined with the image capture apparatus 100. For example, the image capture apparatus 100 may communicate with an external device, such as an external user interface device, via a wired or wireless computing communication link, such as via the data interface 124. The computing communication link may be a direct computing communication link or an indirect computing communication link, such as a link including another device or a network, such as the Internet. The image capture apparatus 100 may transmit images to the external device via the computing communication link.

The external device may store, process, display, or combination thereof, the images. The external user interface device may be a computing device, such as a smartphone, a tablet computer, a smart watch, a portable computer, personal computing device, or another device or combination of devices configured to receive user input, communicate information with the image capture apparatus 100 via the computing communication link, or receive user input and communicate information with the image capture apparatus 100 via the computing communication link. The external user interface device may implement or execute one or more applications to manage or control the image capture apparatus 100. For example, the external user interface device may include an application for controlling camera configuration, video acquisition, video display, or any other configurable or controllable aspect of the image capture apparatus 100. In some implementations, the external user interface device may generate and share, such as via a cloud-based or social media service, one or more images or video clips. In some implementations, the external user interface device may display unprocessed or minimally processed images or video captured by the image capture apparatus 100 contemporaneously with capturing the images or video by the image capture apparatus 100, such as for shot framing or live preview.

Figure 2A:
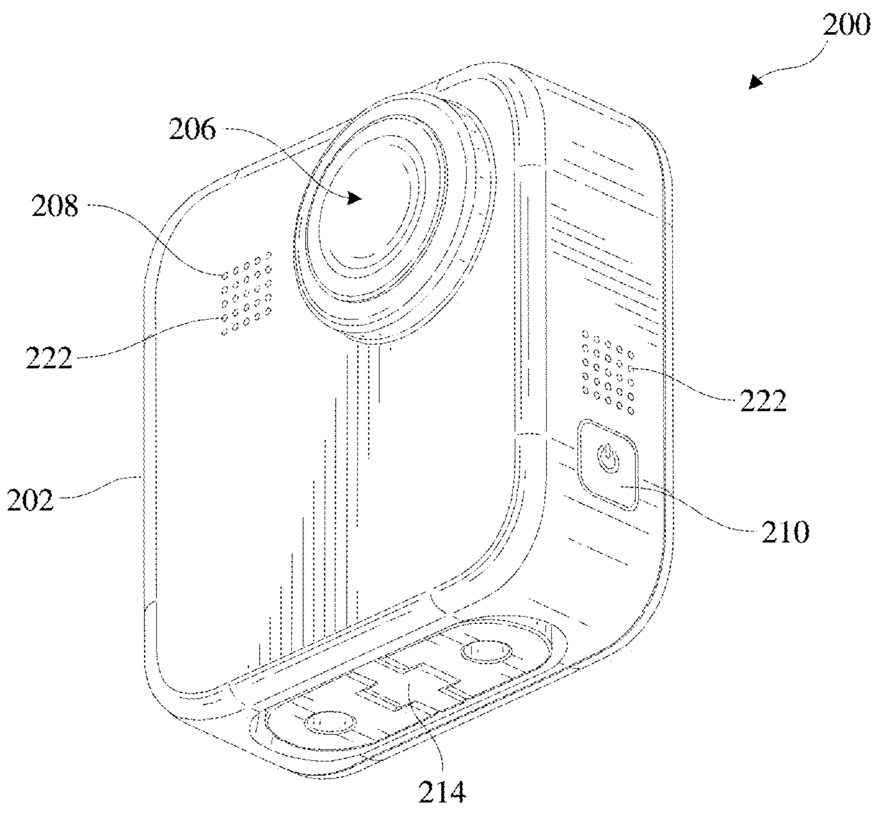
FIGS. 2A-2B are isometric views of another example of an image capture apparatus.
Figure 2B:
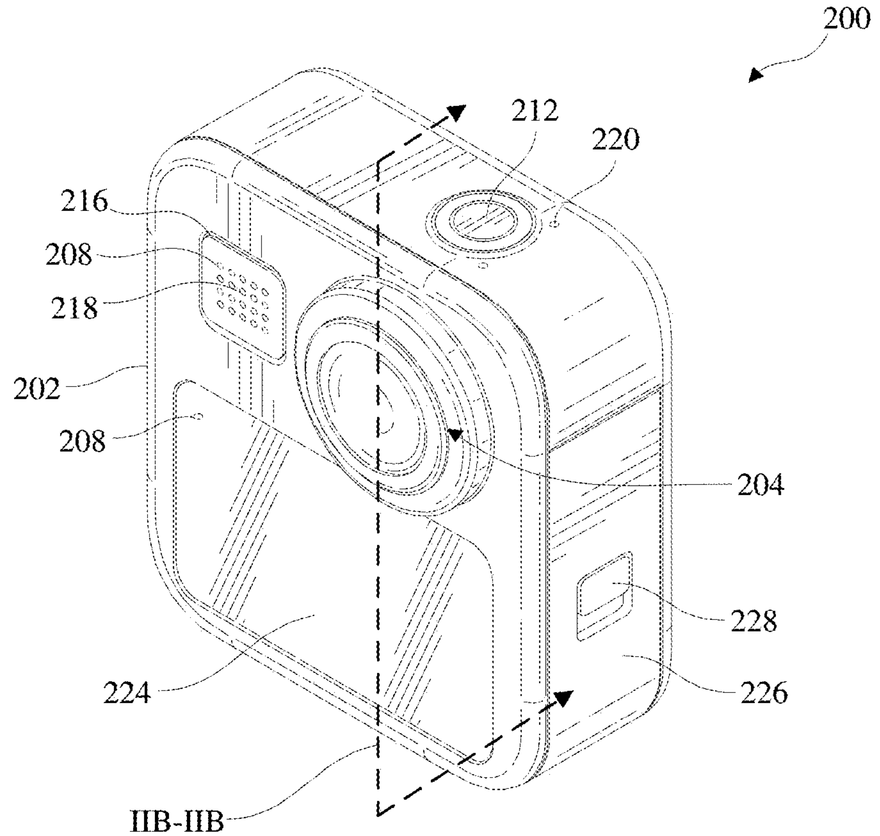

FIGS. 2A-2B illustrate another example of an image capture apparatus 200. The image capture apparatus 200 is similar to the image capture apparatus 100 shown in FIGS. 1A-1B. The image capture apparatus 200 includes a body 202, a first image capture device 204, a second image capture device 206, indicators 208, a mode button 210, a shutter button 212, an interconnect mechanism 214, a drainage channel 216, audio components 218, 220, 222, a display 224, and a door 226 including a release mechanism 228. The arrangement of the components of the image capture apparatus 200 shown in FIGS. 2A-2B is an example, other arrangements of elements may be used.

The body 202 of the image capture apparatus 200 may be similar to the body 102 shown in FIGS. 1A-1B. The first image capture device 204 is structured on a front surface of the body 202. The first image capture device 204 includes a first lens. The first image capture device 204 may be similar to the image capture device 104 shown in FIG. 1A. As shown in FIG. 2A, the image capture apparatus 200 includes the second image capture device 206 structured on a rear surface of the body 202. The second image capture device 206 includes a second lens. The second image capture device 206 may be similar to the image capture device 104 shown in FIG. 1A. The image capture devices 204, 206 are disposed on opposing surfaces of the body 202, for example, in a back-to-back configuration, Janus configuration, or offset Janus configuration. The image capture apparatus 200 may include other image capture devices structured on respective surfaces of the body 202.

As shown in FIG. 2B, the image capture apparatus 200 includes the indicators 208 associated with the audio component 218 and the display 224 on the front surface of the body 202. The indicators 208 may be similar to the indicator 106 shown in FIG. 1A. For example, one of the indicators 208 may indicate a status of the first image capture device 204 and another one of the indicators 208 may indicate a status of the second image capture device 206. Although two indicators 208 are shown in FIGS. 2A-2B, the image capture apparatus 200 may include other indictors structured on respective surfaces of the body 202.

As shown in FIGS. 2A-B, the image capture apparatus 200 includes input mechanisms including the mode button 210, structured on a side surface of the body 202, and the shutter button 212, structured on a top surface of the body 202. The mode button 210 may be similar to the mode button 110 shown in FIG. 1B. The shutter button 212 may be similar to the shutter button 112 shown in FIG. 1A.

The image capture apparatus 200 includes internal electronics (not expressly shown), such as imaging electronics, power electronics, and the like, internal to the body 202 for capturing images and performing other functions of the image capture apparatus 200. An example showing internal electronics is shown in FIG. 5.

As shown in FIGS. 2A-2B, the image capture apparatus 200 includes the interconnect mechanism 214 structured on a bottom surface of the body 202. The interconnect mechanism 214 may be similar to the interconnect mechanism 140 shown in FIG. 1B.

As shown in FIG. 2B, the image capture apparatus 200 includes the drainage channel 216 for draining liquid from audio components of the image capture apparatus 200.

As shown in FIGS. 2A-2B, the image capture apparatus 200 includes the audio components 218, 220, 222, respectively structured on respective surfaces of the body 202. The audio components 218, 220, 222 may be similar to the microphones 128, 130, 132 and the speaker 138 shown in FIGS. 1A-1B. One or more of the audio components 218, 220, 222 may be, or may include, audio sensors, such as microphones, to receive and record audio signals, such as voice commands or other audio, in conjunction with capturing images or video. One or more of the audio components 218, 220, 222 may be, or may include, an audio presentation component that may present, or play, audio, such as to provide notifications or alerts.

As shown in FIGS. 2A-2B, a first audio component 218 is located on a front surface of the body 202, a second audio component 220 is located on a top surface of the body 202, and a third audio component 222 is located on a back surface of the body 202. Other numbers and configurations for the audio components 218, 220, 222 may be used. For example, the audio component 218 may be a drain microphone surrounded by the drainage channel 216 and adjacent to one of the indicators 208 as shown in FIG. 2B.

As shown in FIG. 2B, the image capture apparatus 200 includes the display 224 structured on a front surface of the body 202. The display 224 may be similar to the displays 108, 142 shown in FIGS. 1A-1B. The display 224 may include an I/O interface. The display 224 may include one or more of the indicators 208. The display 224 may receive touch inputs. The display 224 may display image information during video capture. The display 224 may provide status information to a user, such as status information indicating battery power level, memory card capacity, time elapsed for a recorded video, etc. The image capture apparatus 200 may include multiple displays structured on respective surfaces of the body 202. In some implementations, the display 224 may be omitted or combined with another component of the image capture apparatus 200.

As shown in FIG. 2B, the image capture apparatus 200 includes the door 226 structured on, or forming a portion of, the side surface of the body 202. The door 226 may be similar to the door 114 shown in FIG. 1A. For example, the door 226 shown in FIG. 2A includes a release mechanism 228. The release mechanism 228 may include a latch, a button, or other mechanism configured to receive a user input that allows the door 226 to change position. The release mechanism 228 may be used to open the door 226 for a user to access a battery, a battery receptacle, an I/O interface, a memory card interface, etc.

In some embodiments, the image capture apparatus 200 may include features or components other than those described herein, some features or components described herein may be omitted, or some features or components described herein may be combined. For example, the image capture apparatus 200 may include additional interfaces or different interface features, interchangeable lenses, cold shoes, or hot shoes.

Figure 3:
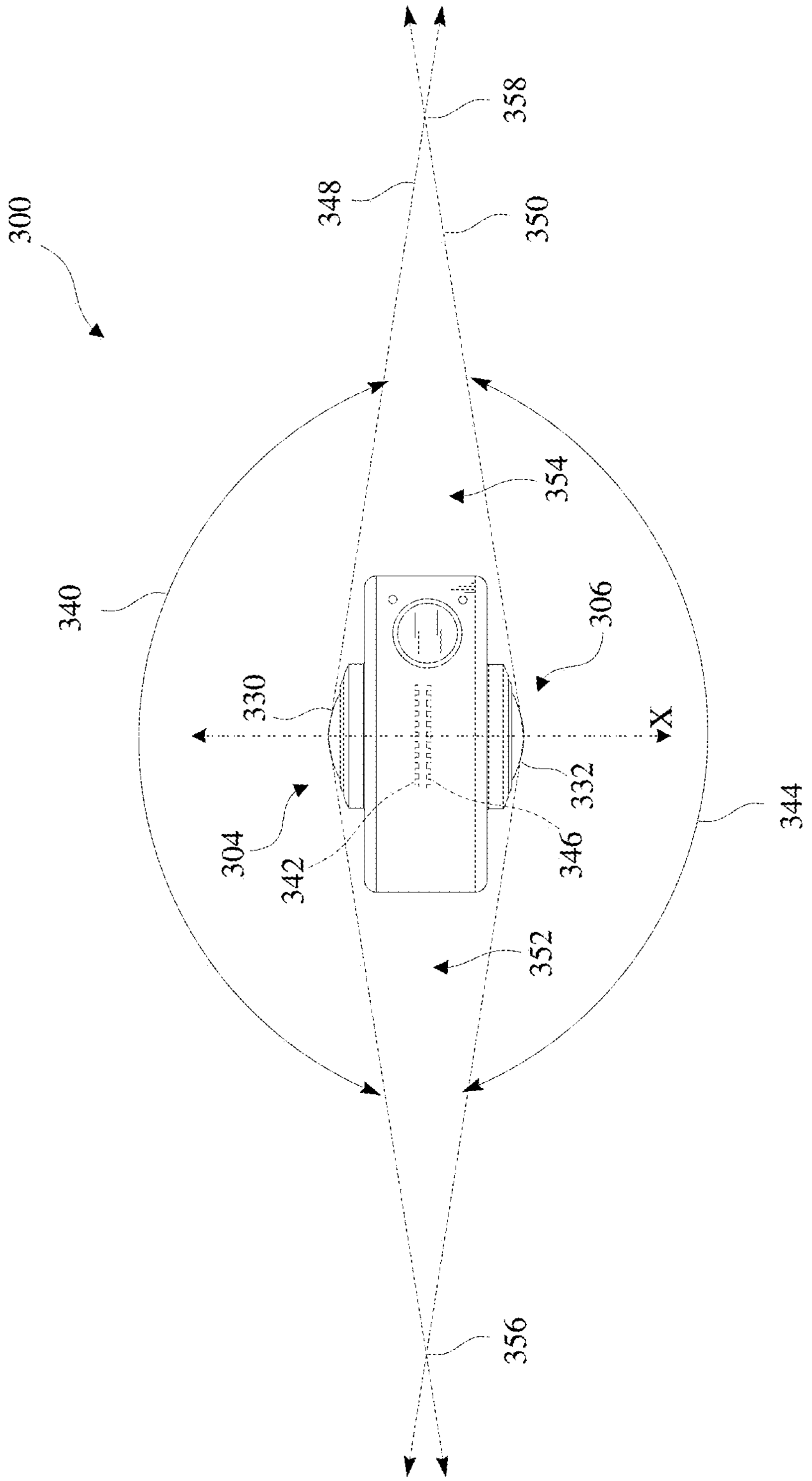
FIG. 3 is a top view of another example of an image capture apparatus.

FIG. 3 is a top view of an image capture apparatus 300. The image capture apparatus 300 is similar to the image capture apparatus 200 of FIGS. 2A-2B and is configured to capture spherical images.

As shown in FIG. 3, a first image capture device 304 includes a first lens 330 and a second image capture device 306 includes a second lens 332. For example, the first image capture device 304 may capture a first image, such as a first hemispheric, or hyper-hemispherical, image, the second image capture device 306 may capture a second image, such as a second hemispheric, or hyper-hemispherical, image, and the image capture apparatus 300 may generate a spherical image incorporating or combining the first image and the second image, which may be captured concurrently, or substantially concurrently.

The first image capture device 304 defines a first field-of-view 340 wherein the first lens 330 of the first image capture device 304 receives light. The first lens 330 directs the received light corresponding to the first field-of-view 340 onto a first image sensor 342 of the first image capture device 304. For example, the first image capture device 304 may include a first lens barrel (not expressly shown), extending from the first lens 330 to the first image sensor 342.

The second image capture device 306 defines a second field-of-view 344 wherein the second lens 332 receives light. The second lens 332 directs the received light corresponding to the second field-of-view 344 onto a second image sensor 346 of the second image capture device 306. For example, the second image capture device 306 may include a second lens barrel (not expressly shown), extending from the second lens 332 to the second image sensor 346.

A boundary 348 of the first field-of-view 340 is shown using broken directional lines. A boundary 350 of the second field-of-view 344 is shown using broken directional lines. As shown, the image capture devices 304, 306 are arranged in a back-to-back (Janus) configuration such that the lenses 330, 332 face in opposite directions, and such that the image capture apparatus 300 may capture spherical images. The first image sensor 342 captures a first hyper-hemispherical image plane from light entering the first lens 330. The second image sensor 346 captures a second hyper-hemispherical image plane from light entering the second lens 332.

As shown in FIG. 3, the fields-of-view 340, 344 partially overlap such that the combination of the fields-of-view 340, 344 forms a spherical field-of-view, except that one or more uncaptured areas 352, 354 may be outside of the fields-of-view 340, 344 of the lenses 330, 332. Light emanating from or passing through the uncaptured areas 352, 354, which may be proximal to the image capture apparatus 300, may be obscured from the lenses 330, 332 and the corresponding image sensors 342, 346, such that content corresponding to the uncaptured areas 352, 354 may be omitted from images captured by the image capture apparatus 300. In some implementations, the image capture devices 304, 306, or the lenses 330, 332 thereof, may be configured to minimize the uncaptured areas 352, 354.

Examples of points of transition, or overlap points, from the uncaptured areas 352, 354 to the overlapping portions of the fields-of-view 340, 344 are shown at 356, 358.

Images contemporaneously captured by the respective image sensors 342, 346 may be combined to form a combined image, such as a spherical image. Generating a combined image may include correlating the overlapping regions captured by the respective image sensors 342, 346, aligning the captured fields-of-view 340, 344, and stitching the images together to form a cohesive combined image. Stitching the images together may include correlating the overlap points 356, 358 with respective locations in corresponding images captured by the image sensors 342, 346. Although a planar view of the fields-of-view 340, 344 is shown in FIG. 3, the fields-of-view 340, 344 are hyper-hemispherical.

A change in the alignment, such as position, tilt, or a combination thereof, of the image capture devices 304, 306, such as of the lenses 330, 332, the image sensors 342, 346, or both, may change the relative positions of the respective fields-of-view 340, 344, may change the locations of the overlap points 356, 358, such as with respect to images captured by the image sensors 342, 346, and may change the uncaptured areas 352, 354, which may include changing the uncaptured areas 352, 354 unequally.

Incomplete or inaccurate information indicating the alignment of the image capture devices 304, 306, such as the locations of the overlap points 356, 358, may decrease the accuracy, efficiency, or both of generating a combined image. In some implementations, the image capture apparatus 300 may maintain information indicating the location and orientation of the image capture devices 304, 306, such as of the lenses 330, 332, the image sensors 342, 346, or both, such that the fields-of-view 340, 344, the overlap points 356, 358, or both may be accurately determined, which may improve the accuracy, efficiency, or both of generating a combined image.

The lenses 330, 332 may be aligned along an axis X as shown, laterally offset from each other (not shown), off-center from a central axis of the image capture apparatus 300 (not shown), or laterally offset and off-center from the central axis (not shown). Whether through use of offset or through use of compact image capture devices 304, 306, a reduction in distance between the lenses 330, 332 along the axis X may improve the overlap in the fields-of-view 340, 344, such as by reducing the uncaptured areas 352, 354.

Images or frames captured by the image capture devices 304, 306 may be combined, merged, or stitched together to produce a combined image, such as a spherical or panoramic image, which may be an equirectangular planar image. In some implementations, generating a combined image may include use of techniques such as noise reduction, tone mapping, white balancing, or other image correction. In some implementations, pixels along a stitch boundary, which may correspond with the overlap points 356, 358, may be matched accurately to minimize boundary discontinuities.

Figure 4A:
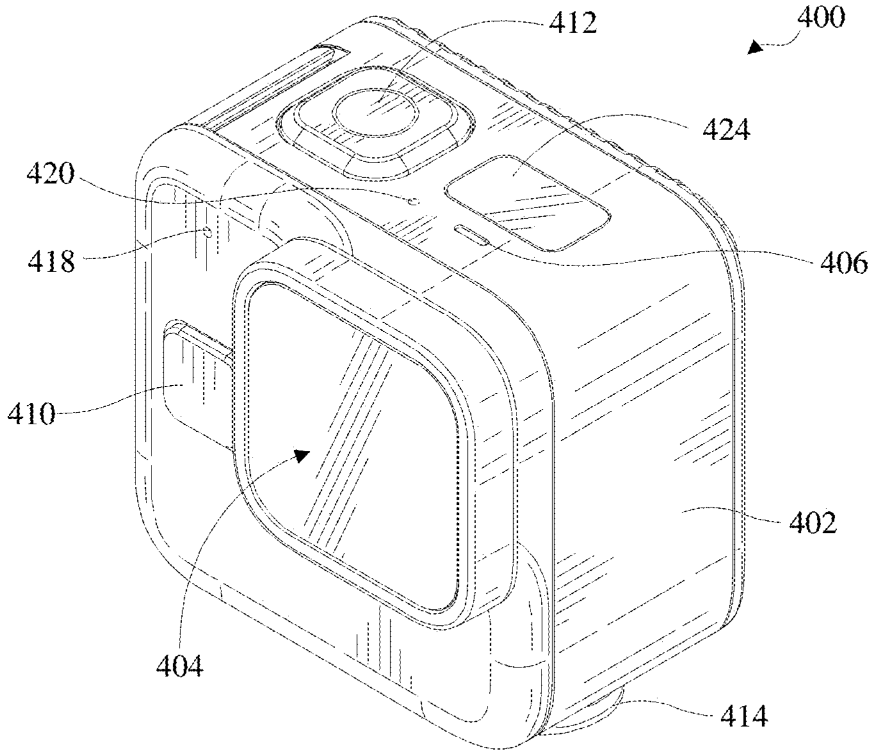
FIGS. 4A-4B are isometric views of another example of an image capture apparatus.
Figure 4B:
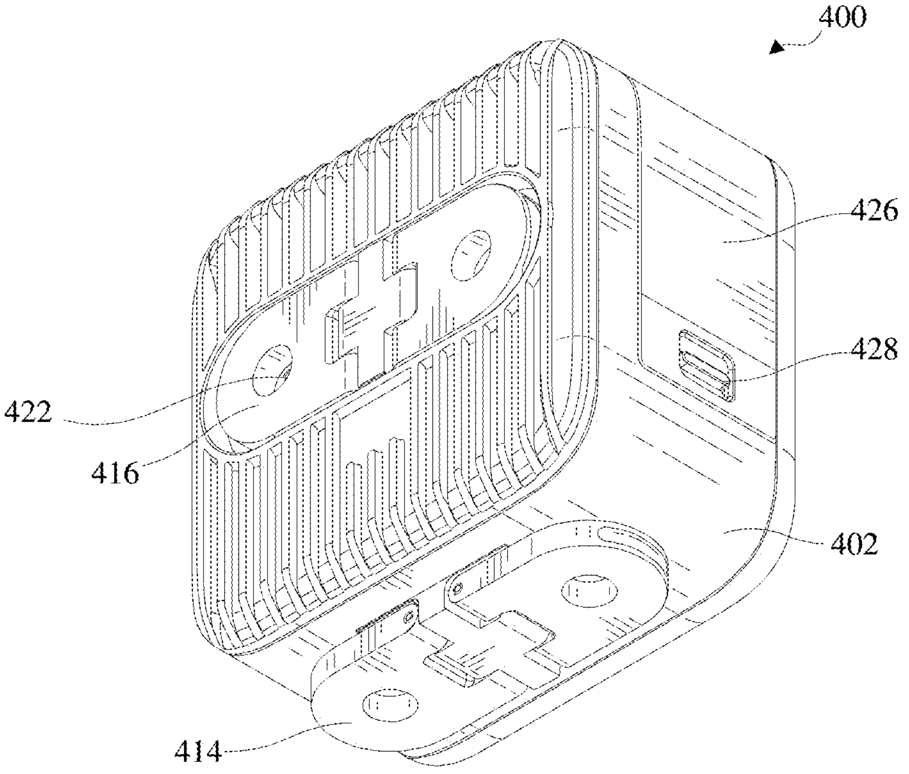

FIGS. 4A-4B illustrate another example of an image capture apparatus 400. The image capture apparatus 400 is similar to the image capture apparatus 100 shown in FIGS. 1A-1B and to the image capture apparatus 200 shown in FIGS. 2A-2B. The image capture apparatus 400 includes a body 402, an image capture device 404, an indicator 406, a mode button 410, a shutter button 412, interconnect mechanisms 414, 416, audio components 418, 420, 422, a display 424, and a door 426 including a release mechanism 428. The arrangement of the components of the image capture apparatus 400 shown in FIGS. 4A-4B is an example, other arrangements of elements may be used.

The body 402 of the image capture apparatus 400 may be similar to the body 102 shown in FIGS. 1A-1B. The image capture device 404 is structured on a front surface of the body 402. The image capture device 404 includes a lens and may be similar to the image capture device 104 shown in FIG. 1A.

As shown in FIG. 4A, the image capture apparatus 400 includes the indicator 406 on a top surface of the body 402. The indicator 406 may be similar to the indicator 106 shown in FIG. 1A. The indicator 406 may indicate a status of the image capture device 204. Although one indicator 406 is shown in FIGS. 4A, the image capture apparatus 400 may include other indictors structured on respective surfaces of the body 402.

As shown in FIGS. 4A, the image capture apparatus 400 includes input mechanisms including the mode button 410, structured on a front surface of the body 402, and the shutter button 412, structured on a top surface of the body 402. The mode button 410 may be similar to the mode button 110 shown in FIG. 1B. The shutter button 412 may be similar to the shutter button 112 shown in FIG. 1A.

The image capture apparatus 400 includes internal electronics (not expressly shown), such as imaging electronics, power electronics, and the like, internal to the body 402 for capturing images and performing other functions of the image capture apparatus 400. An example showing internal electronics is shown in FIG. 5.

As shown in FIGS. 4A-4B, the image capture apparatus 400 includes the interconnect mechanisms 414, 416, with a first interconnect mechanism 414 structured on a bottom surface of the body 402 and a second interconnect mechanism 416 disposed within a rear surface of the body 402. The interconnect mechanisms 414, 416 may be similar to the interconnect mechanism 140 shown in FIG. 1B and the interconnect mechanism 214 shown in FIG. 2A.

As shown in FIGS. 4A-4B, the image capture apparatus 400 includes the audio components 418, 420, 422 respectively structured on respective surfaces of the body 402. The audio components 418, 420, 422 may be similar to the microphones 128, 130, 132 and the speaker 138 shown in FIGS. 1A-1B. One or more of the audio components 418, 420, 422 may be, or may include, audio sensors, such as microphones, to receive and record audio signals, such as voice commands or other audio, in conjunction with capturing images or video. One or more of the audio components 418, 420, 422 may be, or may include, an audio presentation component that may present, or play, audio, such as to provide notifications or alerts.

As shown in FIGS. 4A-4B, a first audio component 418 is located on a front surface of the body 402, a second audio component 420 is located on a top surface of the body 402, and a third audio component 422 is located on a rear surface of the body 402. Other numbers and configurations for the audio components 418, 420, 422 may be used.

As shown in FIG. 4A, the image capture apparatus 400 includes the display 424 structured on a front surface of the body 402. The display 424 may be similar to the displays 108, 142 shown in FIGS. 1A-1B. The display 424 may include an I/O interface. The display 424 may receive touch inputs. The display 424 may display image information during video capture. The display 424 may provide status information to a user, such as status information indicating battery power level, memory card capacity, time elapsed for a recorded video, etc. The image capture apparatus 400 may include multiple displays structured on respective surfaces of the body 402. In some implementations, the display 424 may be omitted or combined with another component of the image capture apparatus 200.

As shown in FIG. 4B, the image capture apparatus 400 includes the door 426 structured on, or forming a portion of, the side surface of the body 402. The door 426 may be similar to the door 226 shown in FIG. 2B. The door 426 shown in FIG. 4B includes the release mechanism 428. The release mechanism 428 may include a latch, a button, or other mechanism configured to receive a user input that allows the door 426 to change position. The release mechanism 428 may be used to open the door 426 for a user to access a battery, a battery receptacle, an I/O interface, a memory card interface, etc.

In some embodiments, the image capture apparatus 400 may include features or components other than those described herein, some features or components described herein may be omitted, or some features or components described herein may be combined. For example, the image capture apparatus 400 may include additional interfaces or different interface features, interchangeable lenses, cold shoes, or hot shoes.

FIG. 5 is a block diagram of electronic components in an image capture apparatus 500. The image capture apparatus 500 may be a single-lens image capture device, a multi-lens image capture device, or variations thereof, including an image capture apparatus with multiple capabilities such as the use of interchangeable integrated sensor lens assemblies. Components, such as electronic components, of the image capture apparatus 100 shown in FIGS. 1A-B, the image capture apparatus 200 shown in FIGS. 2A-B, the image capture apparatus 300 shown in FIG. 3, or the image capture apparatus 400 shown in FIGS. 4A-4B, may be implemented as shown in FIG. 5.

The image capture apparatus 500 includes a body 502. The body 502 may be similar to the body 102 shown in FIGS. 1A-1B, the body 202 shown in FIGS. 2A-2B, or the body 402 shown in FIGS. 4A-4B. The body 502 includes electronic components such as capture components 510, processing components 520, data interface components 530, spatial sensors 540, power components 550, user interface components 560, and a bus 580.

The capture components 510 include an image sensor 512 for capturing images. Although one image sensor 512 is shown in FIG. 5, the capture components 510 may include multiple image sensors. The image sensor 512 may be similar to the image sensors 342, 346 shown in FIG. 3. The image sensor 512 may be, for example, a charge-coupled device (CCD) sensor, an active pixel sensor (APS), a complementary metal-oxide-semiconductor (CMOS) sensor, or an N-type metal-oxide-semiconductor (NMOS) sensor. The image sensor 512 detects light, such as within a defined spectrum, such as the visible light spectrum or the infrared spectrum, incident through a corresponding lens such as the first lens 330 with respect to the first image sensor 342 or the second lens 332 with respect to the second image sensor 346 as shown in FIG. 3. The image sensor 512 captures detected light as image data and conveys the captured image data as electrical signals (image signals or image data) to the other components of the image capture apparatus 500, such as to the processing components 520, such as via the bus 580.

The capture components 510 include a microphone 514 for capturing audio. Although one microphone 514 is shown in FIG. 5, the capture components 510 may include multiple microphones. The microphone 514 detects and captures, or records, sound, such as sound waves incident upon the microphone 514. The microphone 514 may detect, capture, or record sound in conjunction with capturing images by the image sensor 512. The microphone 514 may detect sound to receive audible commands to control the image capture apparatus 500. The microphone 514 may be similar to the microphones 128, 130, 132 shown in FIGS. 1A-1B, the audio components 218, 220, 222 shown in FIGS. 2A-2B, or the audio components 418, 420, 422 shown in FIGS. 4A-4B.

The processing components 520 perform image signal processing, such as filtering, tone mapping, or stitching, to generate, or obtain, processed images, or processed image data, based on image data obtained from the image sensor 512. The processing components 520 may include one or more processors having single or multiple processing cores. In some implementations, the processing components 520 may include, or may be, an application specific integrated circuit (ASIC) or a digital signal processor (DSP). For example, the processing components 520 may include a custom image signal processor. The processing components 520 conveys data, such as processed image data, with other components of the image capture apparatus 500 via the bus 580. In some implementations, the processing components 520 may include an encoder, such as an image or video encoder that may encode, decode, or both, the image data, such as for compression coding, transcoding, or a combination thereof.

Although not shown expressly in FIG. 5, the processing components 520 may include memory, such as a random-access memory (RAM) device, which may be non-transitory computer-readable memory. The memory of the processing components 520 may include executable instructions and data that can be accessed by the processing components 520.

The data interface components 530 communicates with other, such as external, electronic devices, such as a remote control, a smartphone, a tablet computer, a laptop computer, a desktop computer, or an external computer storage device. For example, the data interface components 530 may receive commands to operate the image capture apparatus 500. In another example, the data interface components 530 may transmit image data to transfer the image data to other electronic devices. The data interface components 530 may be configured for wired communication, wireless communication, or both. As shown, the data interface components 530 include an I/O interface 532, a wireless data interface 534, and a storage interface 536. In some implementations, one or more of the I/O interface 532, the wireless data interface 534, or the storage interface 536 may be omitted or combined.

The I/O interface 532 may send, receive, or both, wired electronic communications signals. For example, the I/O interface 532 may be a universal serial bus (USB) interface, such as USB type-C interface, a high-definition multimedia interface (HDMI), a FireWire interface, a digital video interface link, a display port interface link, a Video Electronics Standards Associated (VESA) digital display interface link, an Ethernet link, or a Thunderbolt link. Although one I/O interface 532 is shown in FIG. 5, the data interface components 530 include multiple I/O interfaces. The I/O interface 532 may be similar to the data interface 124 shown in FIG. 1B.

The wireless data interface 534 may send, receive, or both, wireless electronic communications signals. The wireless data interface 534 may be a Bluetooth interface, a ZigBee interface, a Wi-Fi interface, an infrared link, a cellular link, a near field communications (NFC) link, or an Advanced Network Technology interoperability (ANT+) link. Although one wireless data interface 534 is shown in FIG. 5, the data interface components 530 include multiple wireless data interfaces. The wireless data interface 534 may be similar to the data interface 124 shown in FIG. 1B.

The storage interface 536 may include a memory card connector, such as a memory card receptacle, configured to receive and operatively couple to a removable storage device, such as a memory card, and to transfer, such as read, write, or both, data between the image capture apparatus 500 and the memory card, such as for storing images, recorded audio, or both captured by the image capture apparatus 500 on the memory card. Although one storage interface 536 is shown in FIG. 5, the data interface components 530 include multiple storage interfaces. The storage interface 536 may be similar to the data interface 124 shown in FIG. 1B.

The spatial, or spatiotemporal, sensors 540 detect the spatial position, movement, or both, of the image capture apparatus 500. As shown in FIG. 5, the spatial sensors 540 include a position sensor 542, an accelerometer 544, and a gyroscope 546. The position sensor 542, which may be a global positioning system (GPS) sensor, may determine a geospatial position of the image capture apparatus 500, which may include obtaining, such as by receiving, temporal data, such as via a GPS signal. The accelerometer 544, which may be a three-axis accelerometer, may measure linear motion, linear acceleration, or both of the image capture apparatus 500. The gyroscope 546, which may be a three-axis gyroscope, may measure rotational motion, such as a rate of rotation, of the image capture apparatus 500. In some implementations, the spatial sensors 540 may include other types of spatial sensors. In some implementations, one or more of the position sensor 542, the accelerometer 544, and the gyroscope 546 may be omitted or combined.

The power components 550 distribute electrical power to the components of the image capture apparatus 500 for operating the image capture apparatus 500. As shown in FIG. 5, the power components 550 include a battery interface 552, a battery 554, and an external power interface 556 (ext. interface). The battery interface 552 (bat. interface) operatively couples to the battery 554, such as via conductive contacts to transfer power from the battery 554 to the other electronic components of the image capture apparatus 500. The battery interface 552 may be similar to the battery receptacle 126 shown in FIG. 1B. The external power interface 556 obtains or receives power from an external source, such as a wall plug or external battery, and distributes the power to the components of the image capture apparatus 500, which may include distributing power to the battery 554 via the battery interface 552 to charge the battery 554. Although one battery interface 552, one battery 554, and one external power interface 556 are shown in FIG. 5, any number of battery interfaces, batteries, and external power interfaces may be used. In some implementations, one or more of the battery interface 552, the battery 554, and the external power interface 556 may be omitted or combined. For example, in some implementations, the external interface 556 and the I/O interface 532 may be combined.

The user interface components 560 receive input, such as user input, from a user of the image capture apparatus 500, output, such as display or present, information to a user, or both receive input and output information, such as in accordance with user interaction with the image capture apparatus 500.

As shown in FIG. 5, the user interface components 560 include visual output components 562 to visually communicate information, such as to present captured images. As shown, the visual output components 562 include an indicator 564 and a display 566. The indicator 564 may be similar to the indicator 106 shown in FIG. 1A, the indicators 208 shown in FIGS. 2A-2B, or the indicator 406 shown in FIG. 4A. The display 566 may be similar to the display 108 shown in FIG. 1A, the display 142 shown in FIG. 1B, the display 224 shown in FIG. 2B, or the display 424 shown in FIG. 4A. Although the visual output components 562 are shown in FIG. 5 as including one indicator 564, the visual output components 562 may include multiple indicators. Although the visual output components 562 are shown in FIG. 5 as including one display 566, the visual output components 562 may include multiple displays. In some implementations, one or more of the indicator 564 or the display 566 may be omitted or combined.

As shown in FIG. 5, the user interface components 560 include a speaker 568. The speaker 568 may be similar to the speaker 138 shown in FIG. 1B, the audio components 218, 220, 222 shown in FIGS. 2A-2B, or the audio components 418, 420, 422 shown in FIGS. 4A-4B. Although one speaker 568 is shown in FIG. 5, the user interface components 560 may include multiple speakers. In some implementations, the speaker 568 may be omitted or combined with another component of the image capture apparatus 500, such as the microphone 514.

As shown in FIG. 5, the user interface components 560 include a physical input interface 570. The physical input interface 570 may be similar to the mode buttons 110, 210, 410 shown in FIGS. 1A, 2A, and 4A or the shutter buttons 112, 212, 412 shown in FIGS. 1A, 2B, and 4A. Although one physical input interface 570 is shown in FIG. 5, the user interface components 560 may include multiple physical input interfaces. In some implementations, the physical input interface 570 may be omitted or combined with another component of the image capture apparatus 500. The physical input interface 570 may be, for example, a button, a toggle, a switch, a dial, or a slider.

As shown in FIG. 5, the user interface components 560 include a broken line border box labeled "other" to indicate that components of the image capture apparatus 500 other than the components expressly shown as included in the user interface components 560 may be user interface components. For example, the microphone 514 may receive, or capture, and process audio signals to obtain input data, such as user input data corresponding to voice commands. In another example, the image sensor 512 may receive, or capture, and process image data to obtain input data, such as user input data corresponding to visible gesture commands. In another example, one or more of the spatial sensors 540, such as a combination of the accelerometer 544 and the gyroscope 546, may receive, or capture, and process motion data to obtain input data, such as user input data corresponding to motion gesture commands.

Figure 6A:
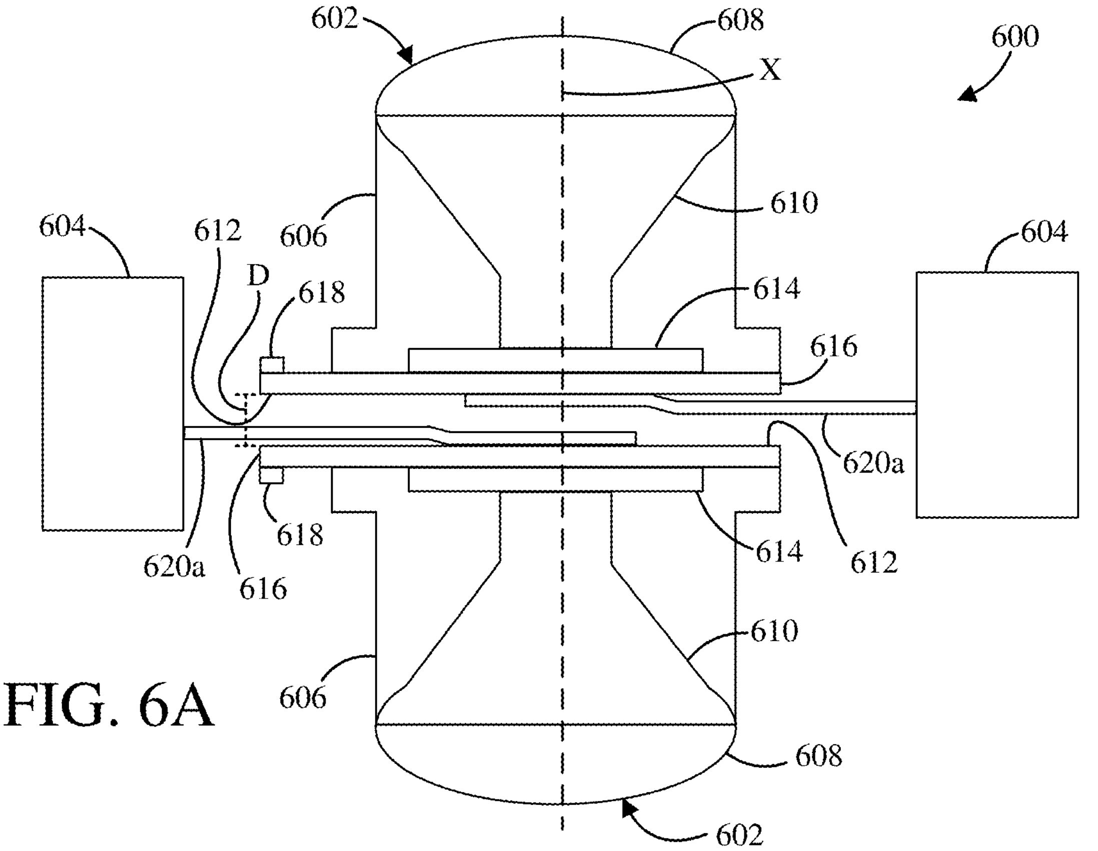
FIG. 6A is a cross-sectional view of an image sensor assembly of the image capture device of FIG. 2B along lines IIB-IIB.
Figure 6B:
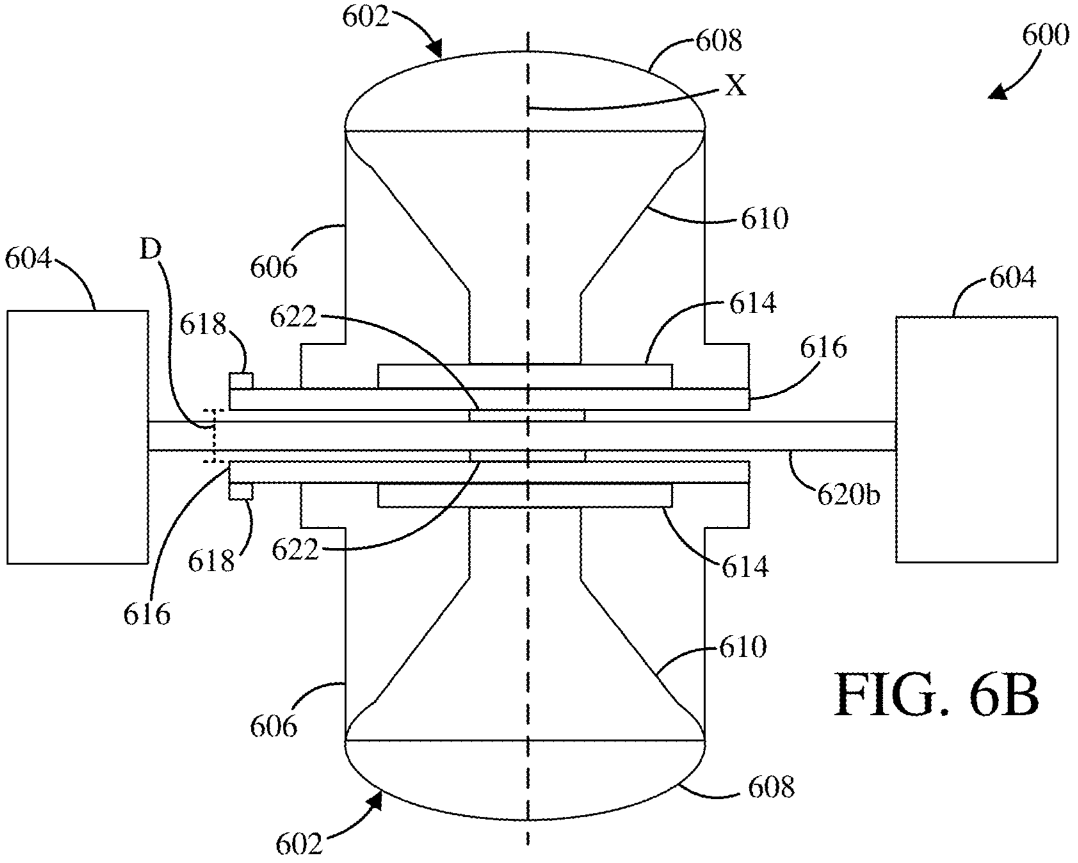
FIG. 6B is a cross-sectional view of the image sensor assembly of the image capture device of FIG. 2B along lines IIB-IIB.

FIG. 6A is a cross-sectional view of an image sensor assembly 600 of the image capture apparatus 200 of FIG. 2B along lines IIB-IIB. FIG. 6B is a cross-sectional view of the image sensor assembly 600 of the image capture apparatus 200 of FIG. 2B along lines IIB-IIB. The image sensor assembly 600 includes a pair of housings 602 (which may be referred to as a housing assembly) and heatsinks 604, and the heatsinks 604 are configured to dissipate heat from each of the image sensor assemblies 600 so that the temperature of components (e.g., an image sensor 610) is lowered and operation time of the image capture apparatus 200 can be extended. The housings 602 each include walls 606 and lenses 608 that in combination enclose sides of image sensors 610 so that the image sensor 610 are protected from external factors, like moisture, dust, etc.

Although not shown in FIGS. 6A-6B, the walls 606 of the housing 602 extend from one image sensor 610 towards another image sensor 610 so that the housing 602 has two lateral openings 612 with a channel extending between the openings 612. FIGS. 6A-6B demonstrate a configuration of the image sensor assemblies 600 that dissipate heat from an inside of the image sensor assemblies 600 to an outside through the two lateral openings 612 of the image sensor assembly 600. In other configurations, the image sensor assemblies 600 include a different heat generating component other than or in combination with the image sensors 610, such as a battery, power supply sub-systems, processor, GPU, GPS, inertial measurement unit ("IMU"), crystal oscillators, or any combination thereof.

The image sensors 610 are aligned along a central axis X (also can be referred to as an optical axis) so that, when images are taken on both sides of the image capture apparatus 200, a symmetric or consistent landscape relative to each side of the image capture apparatus 200 is captured on both sides. This configuration may be considered a 360-degree view. The lenses 608 are similarly aligned along the central axis X for symmetrical and consistency considerations, as discussed with regard to the image sensors 610. The image sensors 610 may have any size sufficient to capture images having a desired quality. In some examples, the image sensors 610 are larger than depicted in FIGS. 6A and 6B such that housing 602 is extended along the central axis X to enclose the image sensors 610. In some examples, the image sensor assemblies 600 are enclosed within the body 202 of the image capture apparatus 200, or in other examples, the image sensor assemblies 600 are a removable component that is partially enclosed and/or extends a distance outside of the body 202 of the image capture apparatus 200.

At an internal side of each of the image sensors 610, an image sensor interface 614 extends between the image sensor 610 and a circuit board 616 so that the image sensor 610 is contained within the walls 606 of the housing 602 and the circuit board 616. The image sensor interface 614 may be an electrical connector, a thermal connector, a stabilizer configured to align the image sensor 610, or any combination thereof. At a peripheral edge of the circuit board 616, a connection feature 618 is positioned, which is configured to interface with one or more other components (not shown) that electrically connect with the image sensor 610 and/or circuit board 616. The circuit boards 616 may have a peripheral edge that extends away from the housing 602 or the circuit boards 616 may have two, three, four, or a plurality of peripheral edges that extend away from the housing so that more than connection features 618 or heat conductors 620*a*, 620*b* may contact the circuit boards 616 at a position outside of the housing 602. One or more of the heat conductors 620*a*, 620*b* may be referred to alone or in combination as a heat conductor assembly. The heat conductors 620*a*, 620*b* may direct heat from the image sensors 610 to the heatsink 604 so that the image sensors 610 maintain a peak steady state at a desirable temperature. By maintaining at the peak steady state at a desirable temperature, the image sensors 610 can function for a longer period of time and with a more desirable level of quality.

The circuit board 616 may be configured such that heat is directed from each of the image sensors 610 to the heat conductors 620*a*, 620*b*. For example, the circuit board 616 may have a trenched configuration that is structurally defined to direct heat in a lateral direction (i.e., from the image sensor interface 614 towards the connection feature 618) or a vias configuration that is structurally defined to direct heat in a vertical direction (i.e., from the image sensor interface 614 towards the opposing image sensor 610. The circuit board 616 may be comprised of any material sufficient to direct heat towards one or more of the heat conductors 620*a*, 620*b*. For example, the circuit board 616 may be comprises of one or more of copper, silicon, polymers, derivatives thereof, or any combination thereof.

The circuit boards 616 are separated by space D so that the circuit boards do not thermally communicate through direct contact. The space D may be any space sufficient to allow the heat conductors 620*a*, 620*b* to extend between the circuit boards 616 and/or move heat from each of the circuit boards 616 to the heatsinks 604. The space D may function to provide sufficient distance between the circuit boards 616 so that heat from one of the circuit board 616 or the image sensor 610 does not interfere with the other of the circuit board 616 or the image sensor 610 through convection. For example, the space D may be a distance of about 1 mm or more, about 3 mm or more, or about 5 mm or more. The space D may be a distance of about 10 mm or less, about 20 mm or less, or about 50 mm or less.

In FIG. 6A, the heat conductors 620*a* connect with the circuit board 616 within the walls 606 and along, at, and/or adjacent to the central axis X that extends between the image sensors 610. The heat conductors 620*a* contact the circuit board 616 at a contact position within the housing 602, elevate away from the circuit board 616, and extend towards the heatsink 604. Each of the heat conductors 620*a* extend to a separate heatsink so that heat from the individual image sensors 610 is respectively directed to an independent heatsink 604 and the operation time of the image capture apparatus 200 is extended. In some examples, the heat conductors 620*a* navigate the image capture apparatus 200 and connect with the same heatsink (not shown). The heat conductors 620*a* may have any configuration or shape sufficient to extend to each of the heatsinks 604 or any other heatsink (not shown) while mitigating heat retention of the image sensor assembly 600. For example, the heat conductors 620*a* may navigate one or more intervening components (not shown) that are positioned between the housing 602 and each or both of the heatsinks 604.

The heat conductors 620*a* function to provide a thermal pathway between the circuit boards 616 and the heatsink 604. The heat conductors 620*a* have a flexible structure so that the heat conductors 620*a* have moldability or bendability around one or more other components or obstructions that may be positioned between the heatsink 604 and the housing 602. The heat conductors 620*a* may connect with one or more intervening components (not shown) before or without further extending towards the heatsink 604 so that a pathway is established between the circuit boards 616 and the heatsinks 604. In some examples, the heat conductors 620*a* are connected and form a contiguous heat conductor (see e.g., the structure of the heat conductor 620*b*) that is composed of flexible materials. The heat conductor 620*a* may be used in the image sensor assembly 600 where a user wants to avoid any physical interference with the structural or optical alignment of the image sensor 620.

The heat conductors 620*a* may be composed of a material that reduces the weight of the image capture apparatus 200 while retaining desirable heat transfer between the respective circuit boards 616 and the heatsinks 604. For example, the heat conductors 620*a* may be composed of diamond, silver, copper, gold, aluminum, graphite, silicon carbide, aluminum nitride, tungsten, zinc, alloys thereof, or any combination thereof. Between each of the individual heat conductors 620*a* and the heatsinks 604 and/or the circuit board 616, a thermal interface material, such as a thermal paste, phase change materials, putties, grease, foam, or adhesive, may be used to improve surface area contact and/or thermal transfer among the components.

In FIG. 6B, the heat conductor 620*b* extends between the circuit boards 616 and the heatsinks 604 to dissipate heat in a balanced configuration between the heatsinks 604. Specifically, the heat conductor 620*b* interfaces with the circuit boards 616 at a position that is within the housing 602 so that heat is moved from an inside to an outside of the image sensor assembly 600 via the heat conductor 620*b*. Between the circuit boards 616 and the heat conductor 620*b*, a thermal interface material 622 is utilized to retain high surface area and/or thermal contact between the circuit board 616 and the heat conductor 620*b*.

An additional thermal interface material (not shown) may be positioned between the heat conductor 620*b* and each of the heatsinks 604 so that heat transfer is improved among the components. In some examples, the heat conductor 620*b* is split into a first and second portion (not shown) that are separated and each individually extend to one of the heatsinks 604. By splitting the heat conductor 620*b*, the image sensors 610 and the circuit boards 616 are thermally separated which may improve heat transfer through the respective heat conductor portions (not shown) to each of the heatsinks 604. In some examples, two separate heat conductors (not shown, see heat conductors 620*a* of FIG. 6A) having rigid structures are utilized to further thermally separate the circuit boards 616.

The heat conductor 620*b* functions to provide a thermal pathway between the circuit boards 616 and the heatsink 604. The heat conductor 620*b* has a rigid structure the extends from the circuit boards 616 to the heatsinks 604 with minimal or no structural flexing. In some examples, the heat conductor 620*b* may provide structural support in combination with or in addition to the walls 606 of the housing 602 so that the image sensor assembly 600 can optically align using, at least in part, the structural support of the heat conductor 620*b*. In some examples, one or more other components (not shown) that are outside of the image sensor assembly 600 may anchor to the heat conductor 620*b* to prevent or mitigate movement of the one or more other components in the image capture apparatus 200. In some examples, the heat conductor 620*b* may have a portion that is rigid and a portion that is flexible, such as the heat conductor 620*a* of FIG. 6A, so that the heat conductor 620*b* can combine structural support to the image sensor assembly 600 and allow navigation around one or more intervening components between the image sensor assembly 600 and one or both of the heatsinks 604.

The heat conductor 620*b* may be composed of any material sufficient to have structural rigidity and move heat between the circuit boards 616 and the heatsinks 604. For example, the heat conductor 620*b* may be composed of ore or more of diamond, silver, copper, gold, aluminum, graphite, silicon carbide, aluminum nitride, tungsten, zinc, alloys thereof, or any combination thereof. The heat conductor 620*b* may include one or more bends or curves that navigate or connect with one or more intervening components (not shown) between the image sensor assembly 600 and the heatsink(s) 604.

Figure 7A:
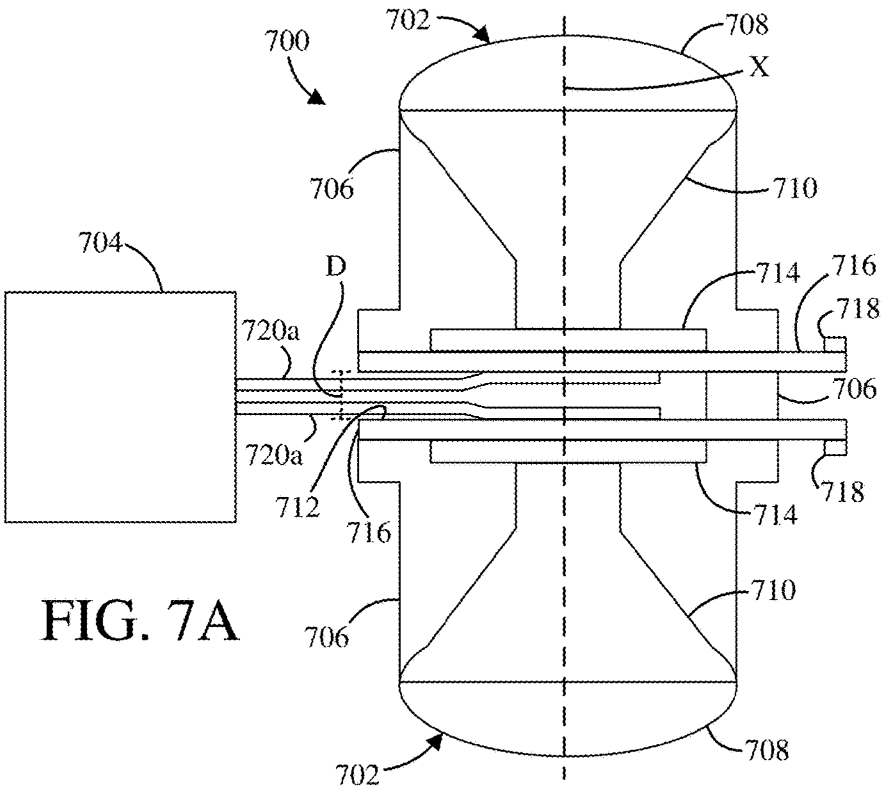
FIG. 7A is a cross-sectional view of an image sensor assembly of the image capture device of FIG. 2B along lines IIB-IIB.
Figure 7B:
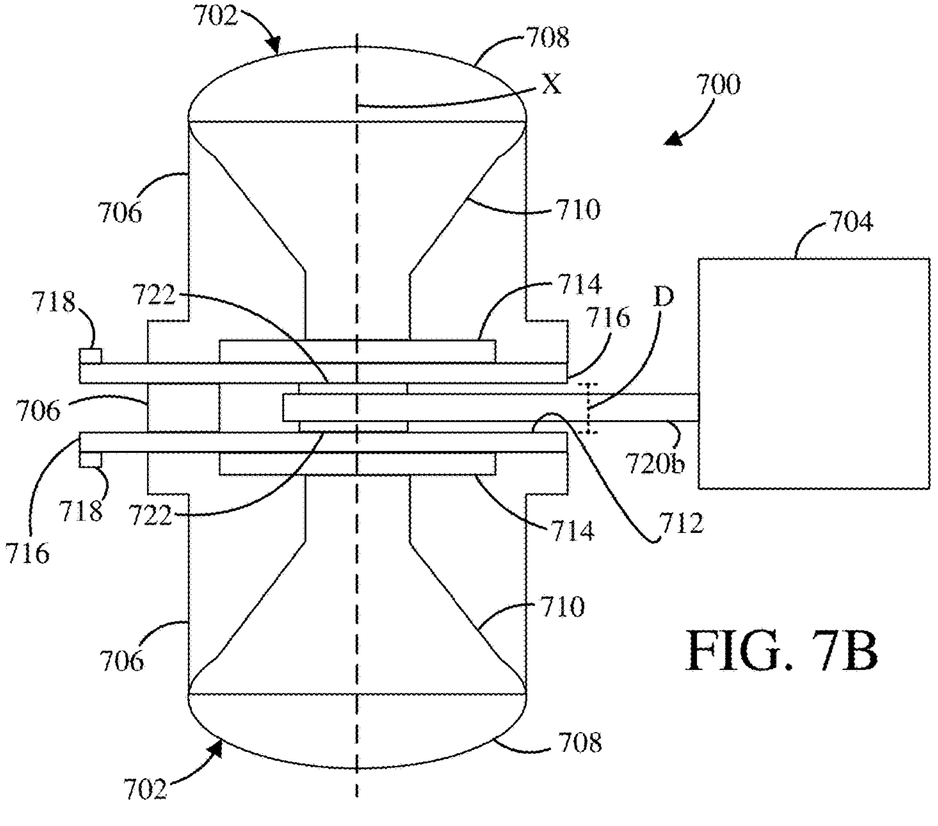
FIG. 7B is a cross-sectional view of the image sensor assembly of the image capture device of FIG. 2B along lines IIB-IIB.

FIG. 7A is a cross-sectional view of another image sensor assembly 700 of the image capture apparatus 200 of FIG. 1A along lines IA-IA. FIG. 7B is a cross-sectional view of the image sensor assembly 700 of the image capture apparatus 200 of FIG. 1A along lines IA-IA. The image sensor assembly 700 is connected with a heatsink 704 and includes a pair of housings 702 each having walls 706, a lens 708, and an image sensor 710, which may be similar to the housings 602, heatsinks 604, walls 606, lenses 608, and image sensors 610 of FIGS. 6A-6B. In FIGS. 7A-7B, the housings 702 are enclosed on at least three walls 706 and each partially define one opening 712 at the exit of a channel that extends between the walls 706 for the image sensor assembly 700 to connect with the heatsink 704. Compared to FIGS. 6A-6B, inclusion of another wall 706 in the housing 702 can provide additional structural support so that the image sensors 710 are stably aligned along the central axis X. Additionally, the configuration of having a single opening, the opening 712, can make assembly and/or production of the image sensor assembly 700 more efficient or cost effective by simplifying production steps.

Each of the image sensors 710 contacts an image sensor interface 714 so that the image sensor 710 can interface with a circuit board 716, which may be similar to the image sensor interface 614 and the circuit board 616 of FIGS. 6A-6B. On a peripheral edge of each of the circuit boards 616, connection features 718 are positioned adjacent to the wall 706 that is opposite of the opening 712, which may be similar to the connection features 618 of FIGS. 6A-6B. By positioning the connection features 718 at a positioned that is opposite of the opening 712, other components (not shown) may connect through wires (not) show and avoid undesirable interactions, such as tangling or heat exchanges, with heat conductors 720*a*, 720*b* that extend out of the opening 712 to the heatsinks 704 for dissipating heat from the image sensors 710 and/or circuit boards 716. The heat conductors 720*a*, 720*b* may be similar to or have similar configurations as the heat conductors 620*a*, 620*b* of FIGS. 6A-6B, and combinations of both of the heat conductors 720*a*, 720*b* may be used in the same image sensor assembly 700.

The circuit boards 716 are separated by space D so that the circuit boards do not thermally communicate through direct contact. The space D may be any space sufficient to allow the heat conductors 720*a*, 720*b* to extend between the circuit boards 716 and/or move heat from each of the circuit boards 716 to the heatsinks 704. The space D may function to provide sufficient distance between the circuit boards 716 so that heat from one of the circuit board 716 or the image sensor 710 does not interfere with the other of the circuit board 716 or the image sensor 710 through convection. For example, the space D may be a distance of about 1 mm or more, about 3 mm or more, or about 5 mm or more. The space D may be a distance of about 10 mm or less, about 20 mm or less, or about 50 mm or less.

In FIG. 7B, the heat conductor 720*b* is connected with the circuit boards 716 through thermal interface materials 722 that are configured to secure and/or facilitate heat transfer between the circuit board 716 and/or image sensor 710 and the heatsink 704. In either FIG. 7A or 7B, an additional thermal interface material (not shown) may be positioned between the heat conductors 720*a*, 720*b* and the heatsinks 704 to secure and/or facilitate heat transfer between the circuit board 716 and/or image sensor 710 and the heatsink 704.

The thermal interface 722 functions to thermally secure the heat conductors 720*a*, 720*b* to one or more other components that generate heat (e.g., the circuit boards 616, 716 and/or the image sensors 610, 710 of FIGS. 6A-7B) or dissipate heat (e.g., heatsinks 604, 704 of FIGS. 6A-7B). The thermal interface material 722 may be similar to the thermal interface material 622 of FIGS. 6A-6B. The thermal interface material 722 may have any physical configuration sufficient to increase or retain surface area between the heat conductors 720*a*, 720*b* and one or more other components without negatively impacting heat transfer capabilities or altering the position of each of image sensors 710 along the central axis X. The thermal interface material 722 may have a configuration of a paste, a tape, a foam, or any combination thereof.

The heatsinks 704 function to dissipate heat from the image sensor assembly 700. The heatsinks 704 may be positioned anywhere within the image capture apparatus 200 so that heat is dissipated throughout the inside of the image capture apparatus 200. For example, the heatsinks 704 may be spaced a distance from the walls 706 and/or circuit boards 716, with or without an intervening component (not shown) positioned between or adjacent to the heatsinks 704 and/or image sensor assembly 700. The heatsinks 704 may be partially or fully integrated with an external wall of image capture apparatus 200 such that the at least one portion of the heatsink(s) 704 is exposed to an external environment outside of the image capture apparatus 200. The heatsink 704 may be an independent component or may be integrated or associated with another component of the image capture apparatus 200, such as a battery, GPU, GPS, or any combination thereof.

Figure 8A:
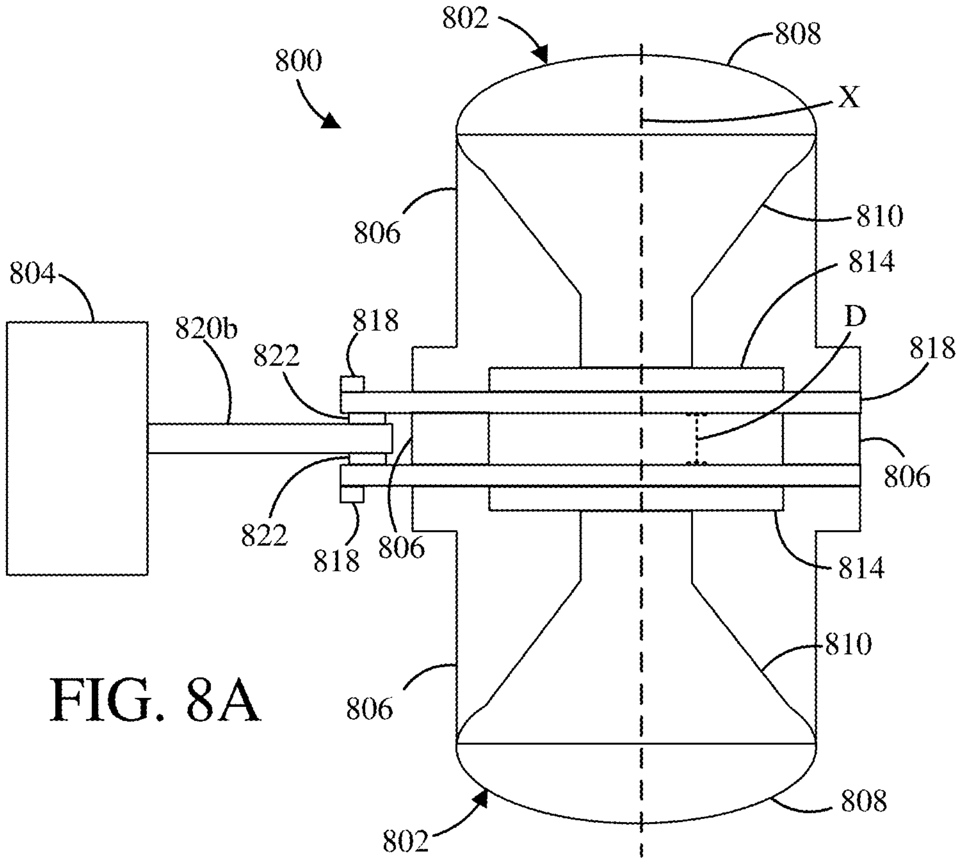
FIG. 8A is a cross-sectional view of an image sensor assembly of the image capture device of FIG. 2B along lines IIB-IIB.
Figure 8B:
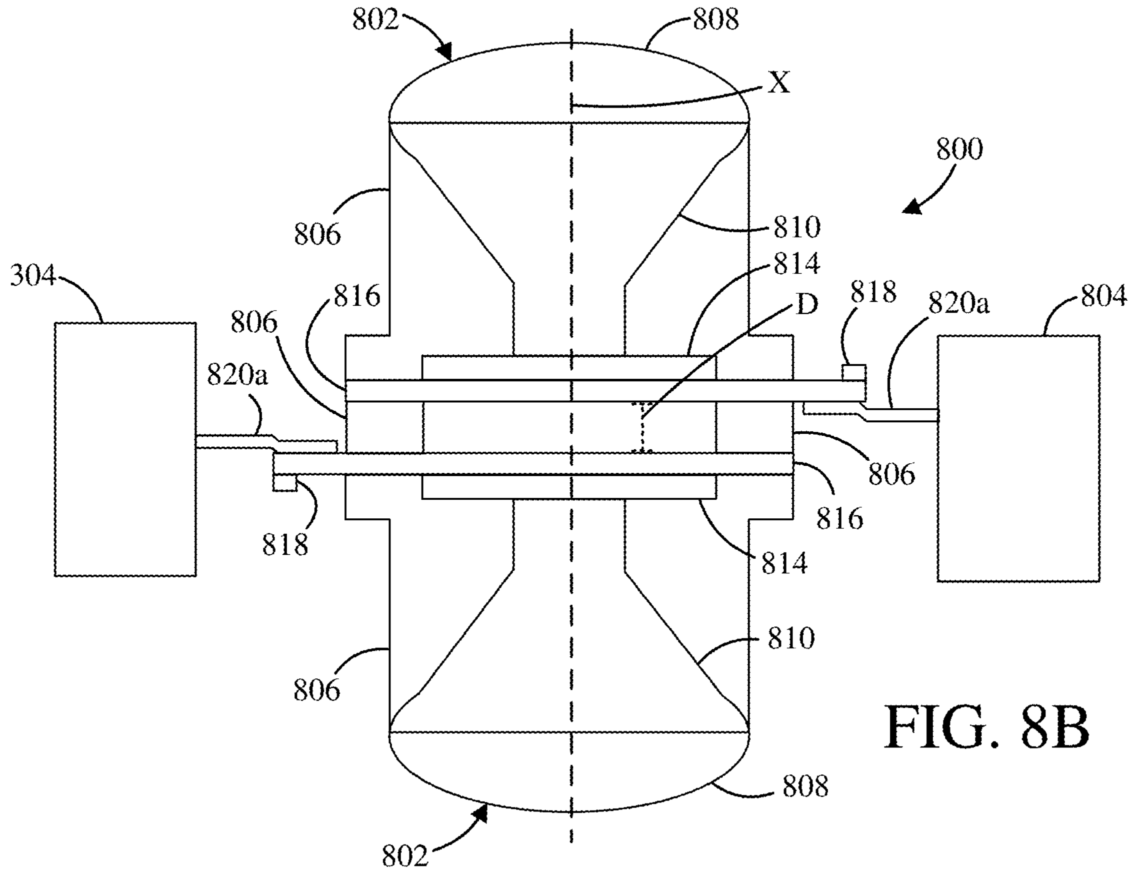
FIG. 8B is a cross-sectional view of the image sensor assembly of the image capture device of FIG. 2B along lines IIB-IIB.

FIG. 8A is a cross-sectional view of another image sensor assembly 800 of the image capture apparatus 200 of FIG. 1A along lines IA-IA. FIG. 8B is a cross-sectional view of the image sensor assembly 800 of the image capture apparatus 200 of FIG. 1A along lines IA-IA. The image sensor assembly 800 is connected with a heatsink 804 and includes a pair of housings 802 each having walls 806, a lens 808, and an image sensor 810, which may be similar to the housings 602, 702, heatsinks 604, 704, walls 606, 706, lenses 608, 708, and image sensors 610, 710 of FIGS. 6A-7B.

In FIGS. 8A-8B, the housings 702 are enclosed on all sides by walls 706. Compared to FIGS. 6A-7B, completely enclosing the image sensors 810 on all sides by walls and a circuit board 812, which may be similar to the circuit boards 616, 716 of FIGS. 6A-7B, may provide additional structure support for retaining image sensor 810 in alignment with a central axis X. Additionally, the enclosed configuration of walls 806 may further mitigate undesirable interactions with the image sensors 810 from external forces, like moistures, dirt, debris, etc. The walls 806 may have any configuration sufficient to protect the image sensors 810 and support their alignment along the central axis X. In some examples, the housings 802 may include three or more, four or more, five or more, six or more, or a plurality of walls that enclose the image sensors. In some examples, the wall 806 may be single contiguous wall that is arranged in a circular or oval configuration around the image sensors 810.

Each of the image sensors 810 contacts an image sensor interface 814 so that the image sensor 810 can interface with a circuit board 816, which may be similar to the image sensor interface 614, 714 and the circuit board 616, 716 of FIGS. 6A-7B. On a peripheral edge of each of the circuit boards 816, connection features 818 are positioned adjacent to the wall 806, which may be similar to the connection features 618, 718 of FIGS. 6A-7B, so that the circuit board 816 can electrically connect with one or more other components (e.g., processors, not shown) that affect the operation of the image sensor 810.

Heat conductors 820*a*, 820*b*, which may be similar or have similar configurations as the heat conductors 620*a*, 620*b*, 720*a*, 720*b* of FIGS. 6A-7B, connect with a surface of the circuit boards 816 that is opposite a surface that the connection feature 818 connects with the circuit boards 816. By positioning the connection features 818 at a positioned that is opposite of a surface that the heat conductors 820*a*, 820*b* is located, the heat conductors 820*a*, 820*b* may dissipate heat from the image sensors 810 through circuit boards

816 in addition to heat generated from interactions between the circuit boards 816 and connection features 818. Each of the heat conductors 820*a*, 820*b* may independently thermally interact or connect with the heatsinks 804, circuit board 816, another component (not shown), or any combination thereof through a thermal interface material 822, which may be similar to the thermal interface material s 622, 722 of FIGS. 6A-7B.

As shown in FIGS. 8A and 8B, the heat conductors 820*a*, 820*b* connect with a circuit boards 816 at locations that are adjacent or proximate to the connection features 818. In other examples, the circuit board 816 extends in a similar manner from a side that is opposite of the connection feature such that a peripheral edge (not shown) extends from the housing 802 as an external portion without a connection feature 818. Having peripheral edge that is external without a connection feature 818 (not shown) may be advantageous to connect the heat conductors 820*a*, 820*b* with the circuit board 816 in a way so that wires (not shown) configured to connect with the connection feature 818 do not tangle with the heat conductors 820*a*, 820*b*.

The circuit board 816 functions in part to dissipate heat from the image sensor 810 to the heat conductors 820*a*, 820*b*. The circuit boards 816 may be similar to the circuit boards 616, 716 of FIGS. 6A-7B. The circuit board 816 may be configured to direct heat from the image sensor 810 to the heat conductor 820*a*, 820*b* that is located on the peripheral edge of the circuit boards 816 or substantial center of the circuit boards 816 along the central axis X. Specifically, for example, the circuit board 816 may have a trenched that directs heat in a lateral direction towards the peripheral edges, which may be advantageous if the user desires to push heat from the space between the circuit boards 816. In other examples, the circuit boards 816 may have a vias configuration that directs heat from image sensor 810 and image sensor interface 814 to the opposing circuit board 816, where the heat conductors 820*a*, 820*b* may be positioned.

The circuit boards 816 are separated by space D so that the circuit boards do not thermally communicate through direct contact. The space D may be any space sufficient to allow the heat conductors 820*a*, 820*b* to extend between the circuit boards 816 and/or move heat from each of the circuit boards 816 to the heatsinks 804. The space D may function to provide sufficient distance between the circuit boards 816 so that heat from one of the circuit board 816 or the image sensor 810 does not interfere with the other of the circuit board 816 or the image sensor 810 through convection. For example, the space D may be a distance of about 1 mm or more, about 3 mm or more, or about 5 mm or more. The space D may be a distance of about 10 mm or less, about 20 mm or less, or about 50 mm or less.

Figure 9A:
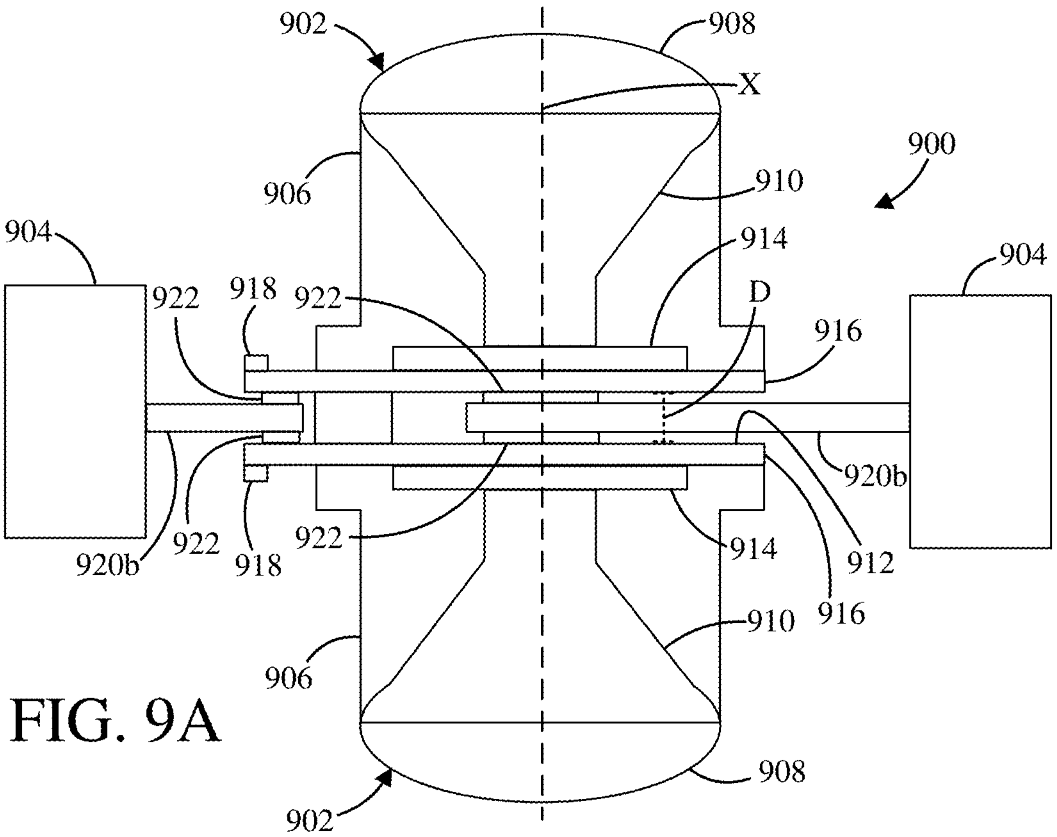
FIG. 9A is a cross-sectional view of an image sensor assembly of the image capture device of FIG. 2B along lines IIB-IIB.
Figure 9B:
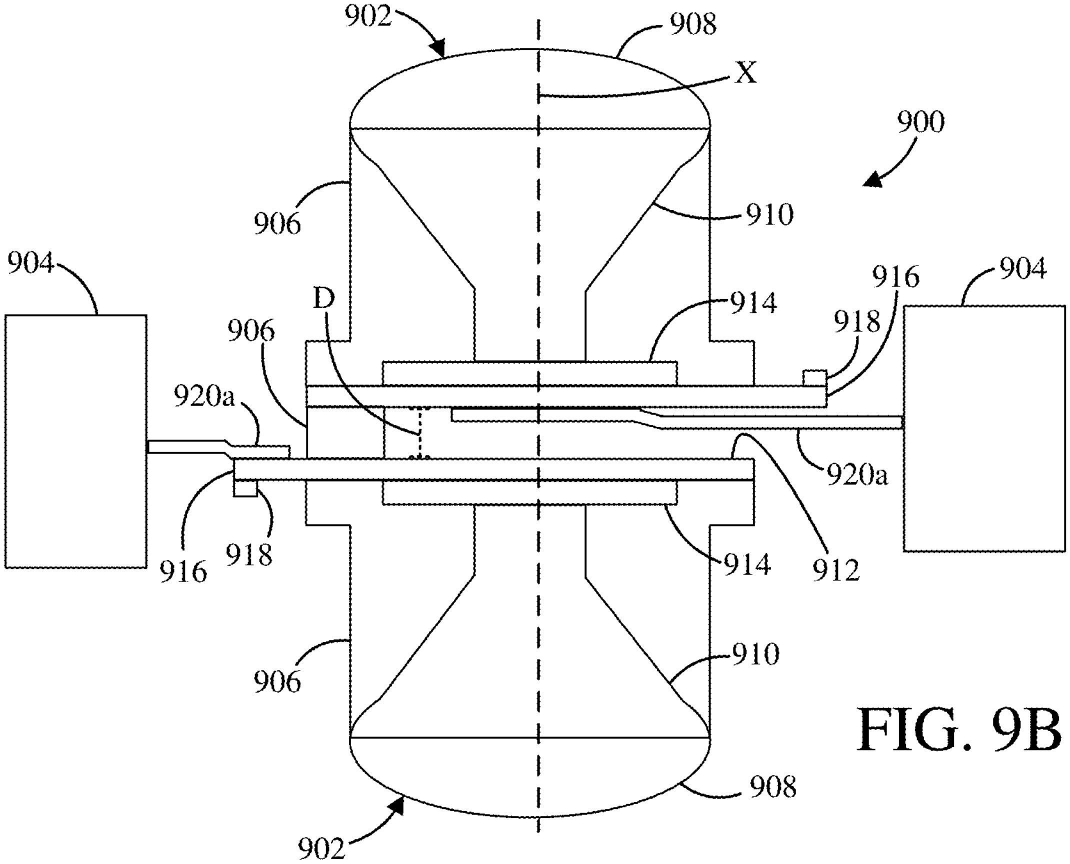
FIG. 9B is a cross-sectional view of the image sensor assembly of the image capture device of FIG. 2B along lines IIB-IIB.
Figure 9C:
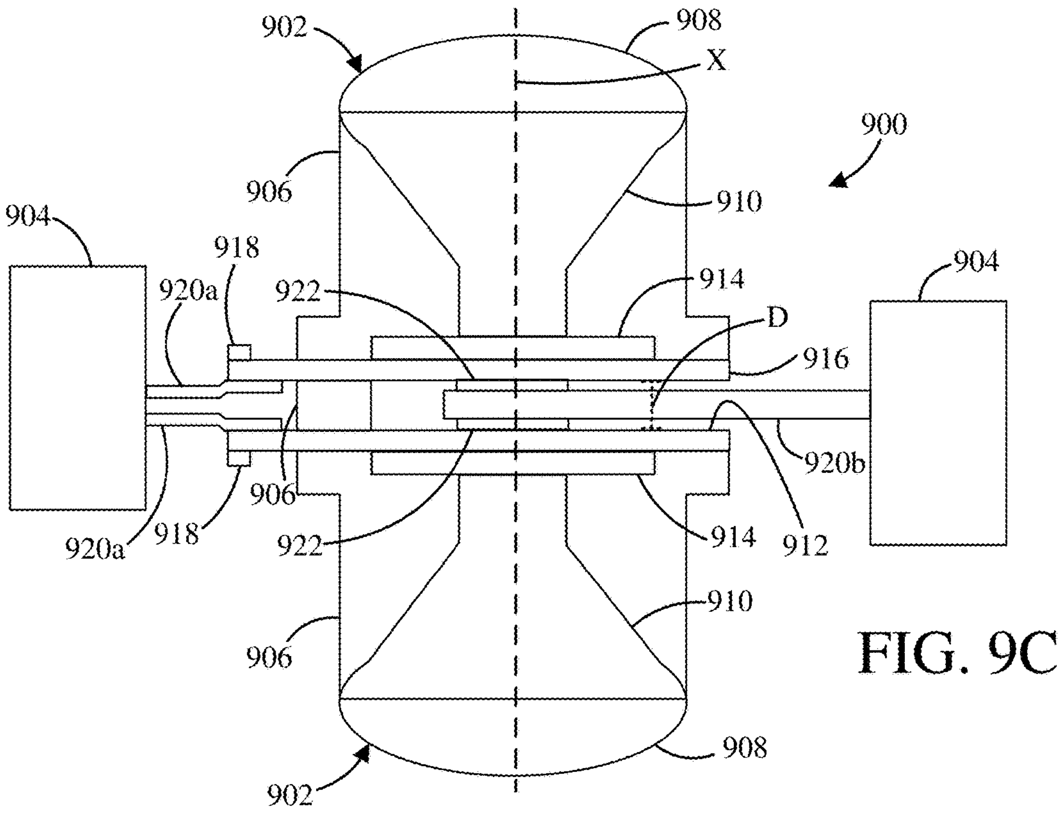
FIG. 9C is a cross-sectional view of the image sensor assembly of the image capture device of FIG. 2B along lines IIB-IIB.
Figure 9D:
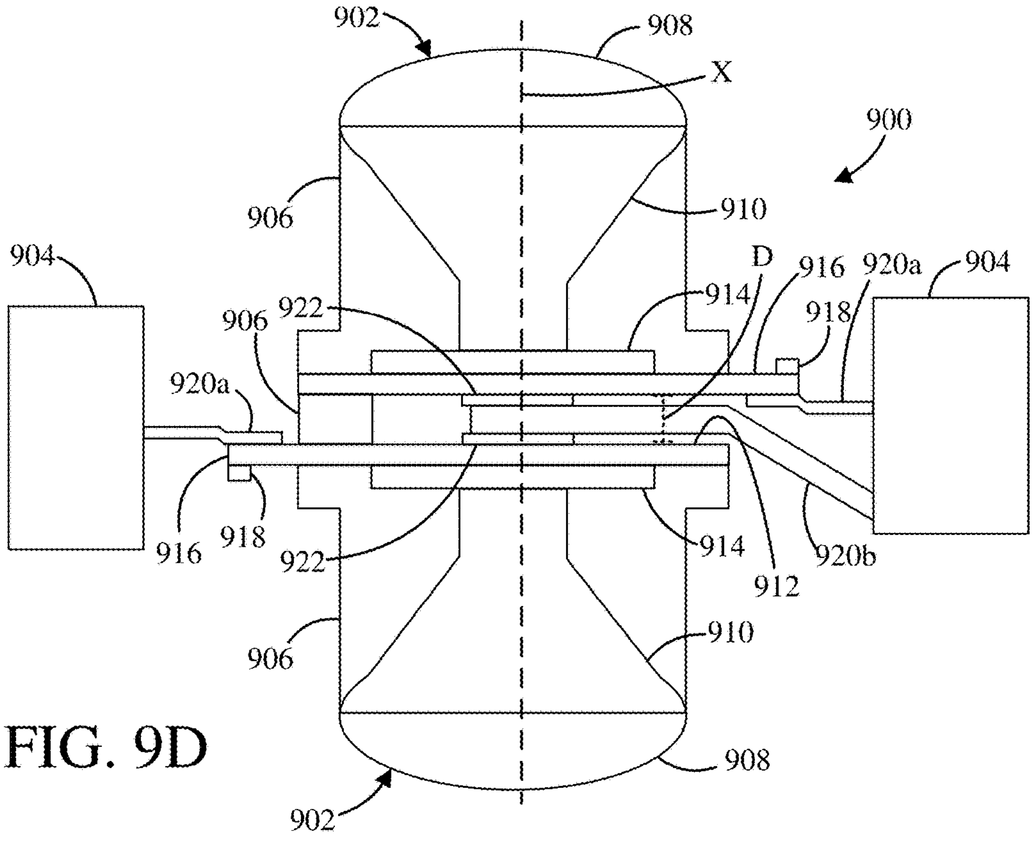
FIG. 9D is a cross-sectional view of the image sensor assembly of the image capture device of FIG. 2B along lines IIB-IIB.

FIG. 9A is a cross-sectional view of another image sensor assembly 900 of the image capture apparatus 200 of FIG. 1A along lines IA-IA. FIG. 9B is a cross-sectional view of the image sensor assembly 900 of the image capture apparatus 200 of FIG. 1A along lines IA-IA. FIG. 9C is a cross-sectional view of the image sensor assembly 900 of the image capture apparatus 200 of FIG. 1A along lines IA-IA. FIG. 9D is a cross-sectional view of the image sensor assembly 900 of the image capture apparatus 200 of FIG. 1A along lines IA-IA. The image sensor assembly 900 is connected with heatsinks 704 and includes a pair of housings 902 each having walls 906, a lens 908, and an image sensor 910, which may be similar to the housings 602, 702, 802 heatsinks 604, 704, 804, walls 606, 706, 806, lenses 608, 708, 808, 608 and image sensors 610, 710, 810 of FIGS. 6A-8B.

In FIGS. 9A-9D, the housings 902 are enclosed on at least three walls 906 and each of the walls 906 partially define a channel that exits at one opening 912 for the image sensor assembly 900 to connect with the heatsink 904. Each of the image sensors 910 contacts an image sensor interface 914 so that the image sensors 910 can interface with a circuit board 916, which may be similar to the image sensor interfaces 614, 714, 814 and the circuit boards 616, 716, 816 of FIGS. 6A-8B. On a peripheral edge of each of the circuit boards 916, connection features 918 are positioned adjacent to the wall 906 and/or opening 912, which may be similar to the connection features 618, 718, 818 of FIGS. 6A-8B.

FIGS. 9A-9D show image sensor assemblies that have the opening 912 and a combination and of different heat conductors 920*a*, 920*b* at various positions to illustrate how differing types of heat conductors 920*a*, 920*b* can be used to lower a temperature of the image sensor 610 and extend operation time of the image capture apparatus 200. The heat conductors 920*a*, 920*b* may be similar to or have similar configurations as the heat conductors 620*a*, 620*b*, 720*a*, 720*b*, 820*a*, 820*a* of FIGS. 6A-8B. In any of the illustrated configurations, each of the heat conductors 920*a*, 920*b* may be substituted for other types of heat conductors 920*a*, 920*b* at any illustrated position because a different arrangement of heat conductors 920*a*, 920*b* may be desired to support the structure of the housing 902 or to navigate internal components (not shown) that intervene between the heatsinks 904 and the housing 902.

Compared to image sensor assemblies 900 of FIGS. 9A-9B, inclusion of another wall 906 in the housing 902 can provide additional structural support so that the image sensors 910 are stably aligned along the central axis X. Compared to the image sensor assemblies 800 of FIGS. 8A-8B, the inclusion of at least one opening 912 allows for the image sensor assembly 900 to include more varied combinations of heat conductors 920*a*, 920*b* to change the configuration of heat dissipation from the image sensors 920. For example, based on the structural arrangement of the image capture apparatus 200, a heat conductor 920*b* that is rigid may be used to anchor the housing 902 to the heatsink 904 or another portion of the image capture apparatus 200.

The circuit boards 916 are separated by space D so that the circuit boards do not thermally communicate through direct contact. The space D may be any space sufficient to allow the heat conductors 920*a*, 920*b* to extend between the circuit boards 916 and/or move heat from each of the circuit boards 916 to the heatsinks 904. The space D may function to provide sufficient distance between the circuit boards 916 so that heat from one of the circuit board 916 or the image sensor 910 does not interfere with the other of the circuit board 916 or the image sensor 910 through convection. For example, the space D may be a distance of about 1 mm or more, about 3 mm or more, or about 5 mm or more. The space D may be a distance of about 10 mm or less, about 20 mm or less, or about 50 mm or less.

In FIG. 9A, the heat conductors 920*b* are both rigid and connect with separate heatsinks 904. These heat conductors 920*b* provide structural support for the housing 902 so that the image sensors 910 remained aligned along the central axis X. With having one of the heat conductors 920*b* extending from a location outside of the housing 902 and adjacent to the connection feature 918 and the other heat conductor 920*b* extending from the location adjacent to the central axis X, heat can be moved away from the housing 902 while retaining desirable structural support from the rigidity of the heat conductors **920*b*. Additionally, since both of the heat conductors 920*b* connect to both of the opposing circuit boards 916, both of the heat conductors 920*b* move heat from each of the circuit boards 916 so that operation time of the image capture apparatus 200** is extended.

In FIG. 9B, the heat conductors **920*a* are flexible and split between separate heatsinks 904 and circuit boards 916. One of the heat conductors 920*a* connects with the circuit board 916 at a location adjacent to the connection feature 918 and flexibly extends towards one of the heatsinks 904. The other of the heat conductors 920*a* extends from the circuit board 916 at a location adjacent to the central axis X that is separate from the other heat conductor 920*a* and circuit board 916. In other words, the heat conductors 920*a* are free of any conductive connection for moving heat. Accordingly, having the heat conductors 920*a* being separate allows for heat from each of the circuit boards 916 to be moved to the heatsinks 904 that are also separated. This configuration of heat conductors 920*a* allows for heat from each of the circuit boards 916 to be individually managed at different locations (i.e., at separate locations adjacent to the central axis X and the connection feature 918**).

In FIG. 9C, both types of the heat conductors **920*a*, 920*b* are included so that a robust system of heat management can be used to split heat between the heatsinks 904. For example, two of the heat conductors 920*a* extend from separate circuit boards 916 to one of the heatsinks 904 so that the heatsink 904 can manage heat from both circuit boards 916. The heat conductor 920*b* moves heat from both of the circuit boards 916 simultaneously to the separate heatsinks 904 and provides a rigid support for the housing 902 that extends from the central axis X, which helps to keep the image sensors 910 aligned along the central axis X. In some examples, the heat conductors 920*a* can extend to two separate heatsinks 904 (not shown) so that heat is managed among three heatsinks (not shown) to extend the operation time of the image capture apparatus 200**.

In FIG. 9D, the connection features 918 are positioned on opposite sides of the housing 902 so that different wires (not shown) can connect with each of the connection features 918 and the heat conductors **920*a* extend from the circuit board 916 on the opposite sides of the housing 902. This configuration of heat conductors 920*a* allow for individual heat management of the circuit boards 916 with each of the heatsinks 904 to improve operation times. Additionally, the heat conductor 920*b* that is rigid and is bent (i.e., includes straight and a bent portions) to connect with the heatsink 904 so that simultaneous heat management from both circuit boards 916 can be sent to the same heatsink, the heatsink 904. In other examples, the heat conductor 920*b* extends to a third heatsinks (not shown) that is separate from the heatsink 904 that is connected with one of the heat conductors 920*a* so that more heatsinks 904 can be used to extend operation time of the image capture apparatus 200**.

The methods and techniques of HEAT CONDUCTOR ASSEMBLY described herein, or aspects thereof, may be implemented by an image capture apparatus, or one or more components thereof, such as the image capture apparatus 100 shown in FIGS. 1A-1B, the image capture apparatus 200 shown in FIGS. 2A-2B, the image capture apparatus 300 shown in FIG. 3, the image capture apparatus 400 shown in FIGS. 4A-4B, or the image capture apparatus 500 shown in FIG. 5. The methods and techniques of HEAT CONDUCTOR ASSEMBLY described herein, or aspects thereof, may be implemented by an image capture device, such as the image capture device 104 shown in FIGS. 1A-1B, one or more of the image capture devices 204, 206 shown in FIGS. 2A-2B, one or more of the image capture devices 304, 306 shown in FIG. 3, the image capture device 404 shown in FIGS. 4A-4B, or an image capture device of the image capture apparatus 500 shown in FIG. 5.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An image capture apparatus, comprising:

first and second image sensors that are configured to generate heat and are opposed a space from each other;

a housing assembly that encloses the first and second image sensors;

first and second circuit boards that are connected respectively and separately with the first and second image sensors, wherein the first and second circuit boards include peripheral edges that extend from the first and second image sensors to an outside of the housing assembly;

a heatsink assembly positioned on the outside of the housing assembly; and a heat conductor assembly that extends between the heatsink assembly and the first and second circuit boards.

2. The image capture apparatus of claim 1, wherein the housing assembly comprises a channel having two separate openings that extend from the space to the outside of the housing assembly, and wherein the heat conductor assembly contacts the first and second circuit boards within the space and extends to the heatsink assembly through the channel.

3. The image capture apparatus of claim 1, wherein the housing assembly comprises an opening to the outside of the housing assembly, and wherein the heat conductor assembly contacts the first and second circuit boards within the space and extends to the heatsink assembly through the opening.

4. The image capture apparatus of claim 1, wherein the heatsink assembly comprises:

a first heatsink connected to the first circuit board through the heat conductor assembly; and a second heatsink connected to the second circuit board through the heat conductor assembly, wherein the first and second heatsinks are separated from each other.

5. The image capture apparatus of claim 4, wherein the heat conductor assembly comprises:

a first heat conductor that connects the first heatsink and the first circuit board; and a second heat conductor that connects the second heatsink and the second circuit board, wherein the first and second heat conductors are separated from each other.

6. The image capture apparatus of claim 1, wherein the heat conductor assembly comprises:

a first heat conductor that extends between the heatsink assembly and at least one of the peripheral edges of the first circuit board; and a second heat conductor that extends between the heatsink assembly and at least one of the peripheral edges of the first circuit board.

7. The image capture apparatus of claim 6, wherein the first and second heat conductors extend to different heatsinks of the heatsink assembly.

8. The image capture apparatus of claim 6, wherein the first and second heat conductors extend from a single heatsink of the heatsink assembly.

9. The image capture apparatus of claim 1, wherein the heat conductor assembly contacts only the peripheral edges of the first and second circuit boards.

10. The image capture apparatus of claim 1, wherein the heat conductor assembly is positioned within the space and contacts only the first and second circuit boards at the space between the first and second circuit boards.

11. An image capture apparatus, comprising: a pair of opposing image sensor assemblies that are configured to generate heat, separated by a space, and aligned along an optical axis; first and second walls that bridge between the pair of opposing image sensor assemblies; a heatsink that is separated from the pair of opposing image sensor assemblies and the first and second walls; and a heat conductor assembly that is connected to the pair of opposing image sensor assemblies, extends through a channel positioned between the first and second walls, and is connected to the heatsink, wherein the heat conductor assembly comprises: a first flexible heat conductor connected with one of the pair of opposing image sensor assemblies and the heatsink through the channel; and a second flexible heat conductor connected with another of the pair of opposing image sensor assemblies and the heatsink or a different heatsink through the channel, wherein the first and second flexible heat conductors are separated from each other within the channel.

12. The image capture apparatus of claim 11, further comprising a third wall that bridges between the pair of opposing image sensor assemblies and the first and second walls.

13. The image capture apparatus of claim 11, wherein the heat conductor assembly comprises: a rigid heat conductor that extends between the heatsink and the pair of opposing image sensor assemblies, wherein the rigid heat conductor is connected to each of the pair of opposing image sensor assemblies by a separate thermal pad or a separate thermal paste.

14. The image capture apparatus of claim 13, wherein the rigid heat conductor is connected with the heatsink and a different heatsink that is separate.

15. An image capture apparatus, comprising:

an image sensor assembly, comprising:

a housing that includes one or more openings;

first and second image sensors that are optically aligned and fully enclosed within the housing;

a first circuit board partially enclosed in the housing and thermally connected with the first image sensor; and a second circuit board partially enclosed in the housing, opposed a space from the first circuit board, and thermally connected with the second image sensor;

a heatsink external of the housing and configured to dissipate heat; and a heat conductor assembly positioned between the first and second circuit boards, the heat conductor assembly configured to thermally couple the heatsink with a portion of the first and second circuit boards that are independently positioned within or external of the housing.

16. The image capture apparatus of claim 15, further comprising:

a body that encloses the image sensor assembly, the heatsink, and the heat conductor assembly.

17. The image capture apparatus of claim 15, wherein the heat conductor assembly and the first and second circuit boards are connected by a thermal paste or a thermal pad.

18. The image capture apparatus of claim 17, wherein the heat conductor assembly comprises a rigid heat conductor positioned between the first and second circuit board.

19. The image capture apparatus of claim 15, wherein the heat conductor assembly comprises:

a first heat conductor that connects the heatsink and the first circuit board; and a second heat conductor that connects the heatsink and the second circuit board.

* * * * *